United States Patent
Wang et al.

(10) Patent No.: US 10,014,331 B2
(45) Date of Patent: Jul. 3, 2018

(54) FIELD-EFFECT TRANSISTOR DEVICES HAVING PROXIMITY CONTACT FEATURES

(71) Applicant: SKYWORKS SOLUTIONS, INC., Woburn, MA (US)

(72) Inventors: Hailing Wang, Acton, MA (US); Hanching Fuh, Allston, MA (US); Dylan Charles Bartle, Arlington, MA (US); Jerod F. Mason, Bedford, MA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/475,631

(22) Filed: Mar. 31, 2017

(65) Prior Publication Data

US 2017/0287953 A1 Oct. 5, 2017

Related U.S. Application Data

(60) Provisional application No. 62/316,521, filed on Mar. 31, 2016.

(51) Int. Cl.
| | |
|---|---|
| *H01L 27/13* | (2006.01) |
| *H01L 29/10* | (2006.01) |
| *H01L 29/06* | (2006.01) |
| *H04B 1/44* | (2006.01) |

(52) U.S. Cl.
CPC .......... *H01L 27/13* (2013.01); *H01L 29/0684* (2013.01); *H01L 29/1087* (2013.01); *H04B 1/44* (2013.01)

(58) Field of Classification Search
CPC ............................ H01L 27/13; H01L 29/1087
See application file for complete search history.

(56) References Cited

U.S. PATENT DOCUMENTS

| | | | | |
|---|---|---|---|---|
| 8,076,750 B1* | 12/2011 | Kerr | ...................... | H01L 23/645 257/528 |
| 2004/0029310 A1* | 2/2004 | Bernds | .................... | H01L 27/28 438/99 |
| 2012/0313173 A1* | 12/2012 | Dickey | ............... | H01L 27/1203 257/347 |

* cited by examiner

*Primary Examiner* — Tuan H Nguyen
(74) *Attorney, Agent, or Firm* — Chang & Hale LLP

(57) ABSTRACT

Field-effect transistor (FET) devices are described herein that include an insulator layer, a field-effect transistor implemented over the insulator layer, a substrate layer implemented under the insulator layer, and a proximity electrode that extends at least partially through the insulator layer and positioned from the FET by a distance that is less than about 5 μm. The FET device can include one or more substrate contact features as well.

20 Claims, 23 Drawing Sheets

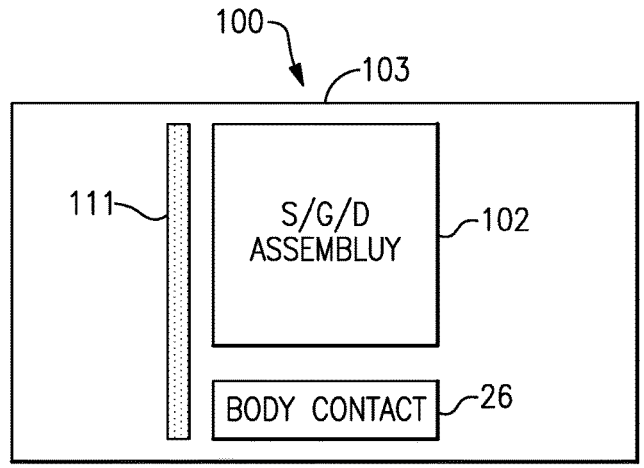
FIG.18
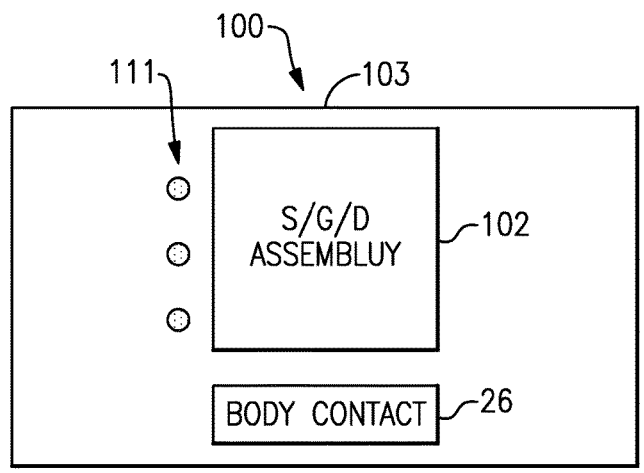
FIG.19
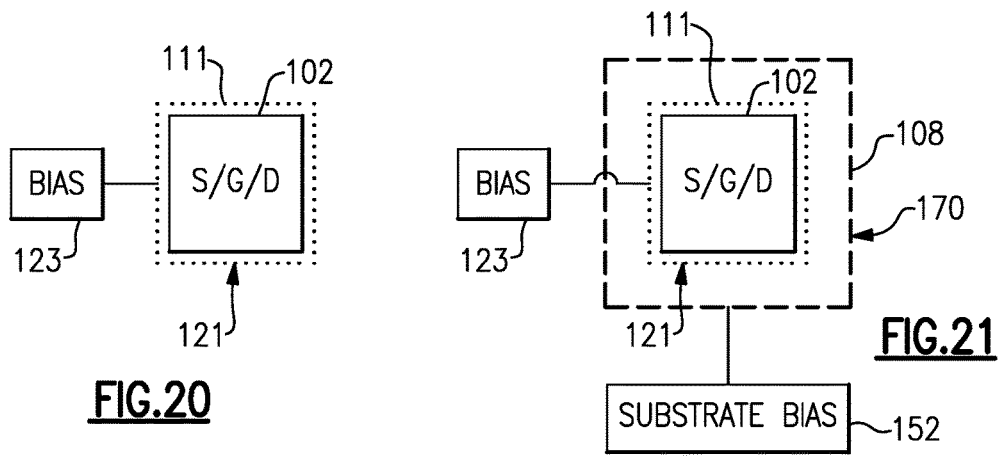
FIG.20
FIG.21

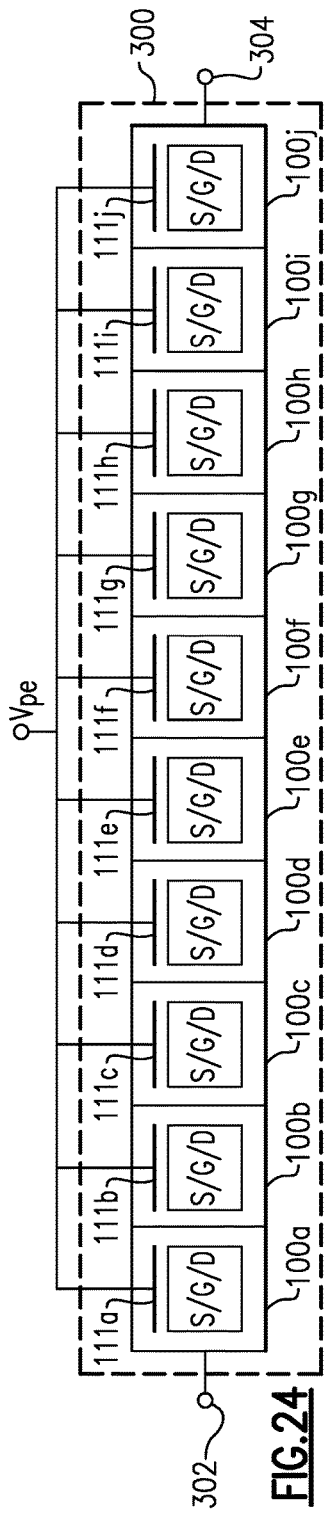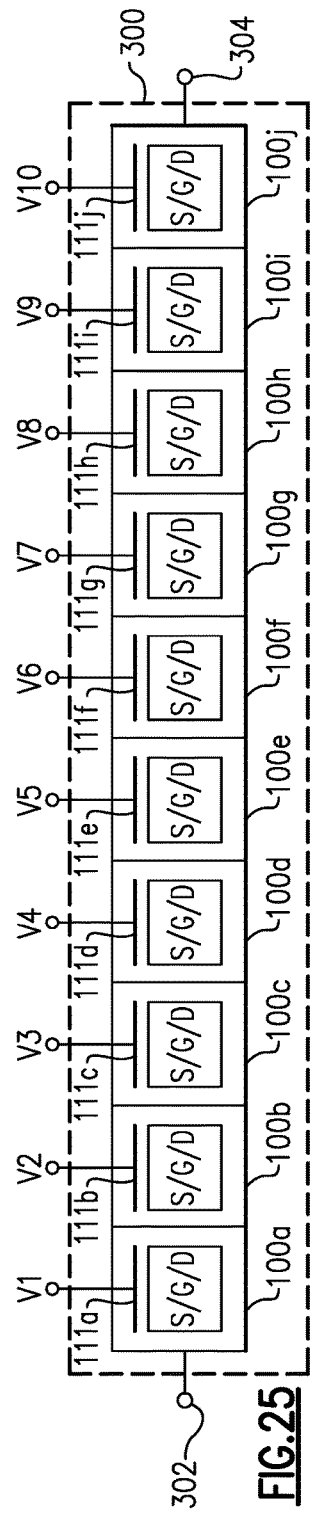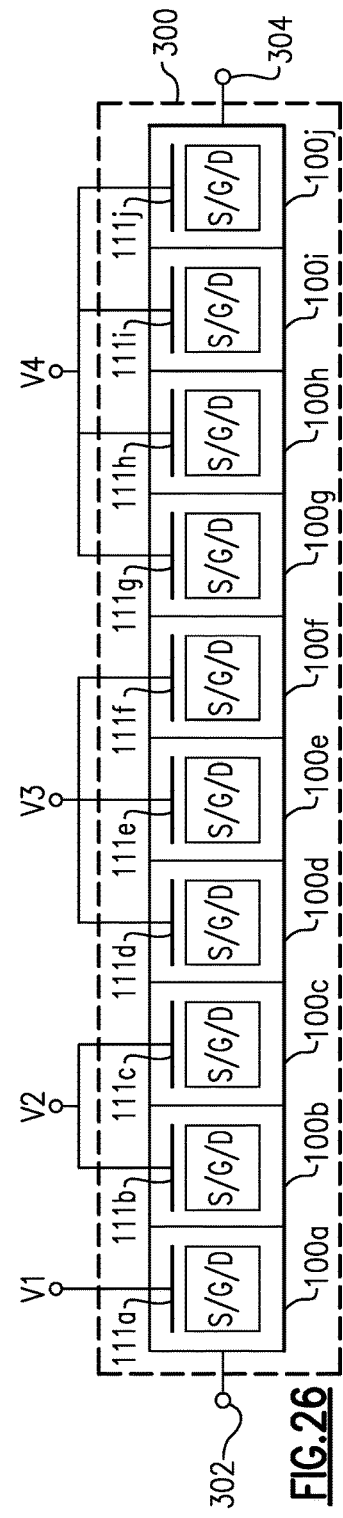

FIELD-EFFECT TRANSISTOR DEVICES HAVING PROXIMITY CONTACT FEATURES

CROSS-REFERENCE TO RELATED APPLICATIONS

This application claims priority to U.S. Prov. App. No. 62/316,521 filed Mar. 31, 2016, entitled "Field-Effect Transistor Devices Having Proximity Contact Features," which is expressly incorporated by reference herein in its entirety for all purposes.

BACKGROUND

Field

The present disclosure generally relates to field-effect transistor (FET) devices and more particularly to proximity contact features for such FET devices.

Description of Related Art

In electronics applications, field-effect transistors (FETs) can be utilized as switches and in amplifiers. Switches can allow, for example, routing of radio-frequency (RF) signals in wireless devices. Amplifiers can amplify signals for transmission or amplify received signals.

SUMMARY

According to a number of implementations, the present disclosure relates to a radio-frequency (RF) device that includes an insulator layer, a field-effect transistor (FET) implemented over the insulator layer, a substrate layer implemented under the insulator layer, and a proximity electrode implemented to extend at least partially through the insulator layer, and positioned to be laterally offset from the FET by an offset distance that is less than 5 µm.

In some embodiments, the RF device also includes an electrical connection implemented to provide a signal to the proximity electrode to adjust an operating condition of the FET. In some embodiments, the RF device also includes a substrate contact feature implemented to provide an electrical connection to the substrate layer. In further embodiments, the substrate contact feature is positioned to be laterally spaced from the FET by a distance greater than or equal to 5 µm.

In some embodiments, the offset distance is less than or equal to 4 µm. In some embodiments, the offset distance is less than or equal to 3 µm. In some embodiments, the offset distance is less than or equal to 2 µm. In some embodiments, the offset distance is less than or equal to 1 µm.

In some embodiments, the proximity electrode is configured to extend through the insulator layer and contact at least a portion of the substrate layer. In some embodiments, the RF device also includes an interface layer implemented between the substrate layer and the insulator layer.

In some embodiments, the interface layer includes a trap-rich layer. In further embodiments, the proximity electrode is configured to extend through the insulator layer but not the trap-rich layer. In further embodiments, the proximity electrode is configured to extend through the insulator layer and the trap-rich layer.

In some embodiments, the substrate layer includes a plurality of doped regions having amorphous and high resistivity properties. In further embodiments, the proximity electrode is configured to extend through the insulator layer but not the doped regions. In further embodiments, the proximity electrode is configured to extend through the insulator layer and the doped regions.

In some embodiments, the substrate layer is a silicon handle layer. In some embodiments, the insulator layer includes a buried oxide (BOX) layer.

According to a number of implementations, the present disclosure relates to a method for fabricating a radio-frequency (RF) device, the method including forming a field-effect transistor (FET) over an insulator layer that is over a substrate layer, and forming a conductive feature that extends at least partially through the insulator layer at a location laterally offset from the FET by an offset distance that is less than 5 µm.

According to a number of implementations, the present disclosure relates to a radio-frequency (RF) module that includes a packaging substrate configured to receive a plurality of devices. The RF module also includes a switching device mounted on the packaging substrate, the switching device including a field-effect transistor (FET) implemented over an insulator layer and a substrate layer implemented under the insulator layer, the switching device further including a proximity electrode implemented to extend at least partially through the insulator layer, and positioned to be laterally offset from the FET by an offset distance that is less than 5 µm.

In some embodiments, the RF module is a switch module. In some embodiments, the substrate layer is part of a silicon-on-insulator (SOI) substrate.

According to a number of implementations, the present disclosure relates to a wireless device that includes a transceiver configured to process radio-frequency (RF) signals. The wireless device also includes an RF module in communication with the transceiver, the RF module including a switching device having a field-effect transistor (FET) implemented over an insulator layer and a substrate layer implemented under the insulator layer, the switching device further including a proximity electrode implemented to extend at least partially through the insulator layer, and positioned to be laterally offset from the FET by an offset distance that is less than 5 µm. The wireless device also includes an antenna in communication with the RF module, the antenna configured to facilitate transmitting and/or receiving of the RF signals.

For purposes of summarizing the disclosure, certain aspects, advantages and novel features have been described herein. It is to be understood that not necessarily all such advantages may be achieved in accordance with any particular embodiment. Thus, one or more of the disclosed features may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 18 illustrates an example of an SOI FET device with one or more conductive trenches that form proximity electrodes relative to an active FET.

FIG. 19 illustrates an example of an SOI FET device with one or more conductive vias that form proximity electrodes relative to an active FET.

FIG. 20 illustrates a proximity electrode biased with a bias circuit wherein the pattern of proximity electrodes is implemented without a substrate contact feature.

FIG. 21 illustrates a proximity electrode biased with a bias circuit wherein the pattern of proximity electrodes is implemented with a substrate contact feature.

FIG. 24 illustrates an example of a plurality of SOI FET devices implemented in a stack configuration wherein the stack is biased using a common bias signal that is provided to each proximity electrode.

FIG. 25 illustrates an example of a plurality of SOI FET devices implemented in a stack configuration wherein the stack is biased using a separate bias signal provided to respective proximity electrodes.

FIG. 26 illustrates an example of a plurality of SOI FET devices implemented in a stack configuration wherein the stack is biased using one or more common bias signals provided to corresponding groups of one or more proximity electrodes.

DETAILED DESCRIPTION OF SOME EMBODIMENTS

The headings provided herein, if any, are for convenience only and do not necessarily affect the scope or meaning of the claimed invention.

Disclosed herein are various examples of a field-effect transistor (FET) device having one or more regions relative to an active FET portion configured to provide a desired operating condition for the active FET. In such various examples, terms such as FET device, active FET portion, and FET are sometimes used interchangeably, with each other, or some combination thereof. Accordingly, such interchangeable usage of terms should be understood in appropriate contexts.

Figure 1:
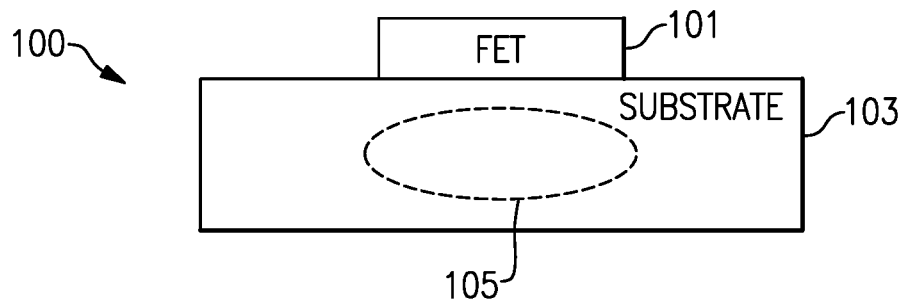
FIG. 1 illustrates an example of a FET device having an active FET implemented on a substrate.

FIG. 1 illustrates an example of a FET device 100 having an active FET 101 implemented on a substrate 103. As described herein, such a substrate can include one or more layers configured to facilitate, for example, operating functionality of the active FET, processing functionality for fabrication and support of the active FET, etc. For example, if the FET device 100 is implemented as a silicon-on-Insulator (SOI) device, the substrate 103 can include an insulator layer such as a buried oxide (BOX) layer, an interface layer, and a handle wafer layer.

FIG. 1 further illustrates that in some embodiments, a region 105 below the active FET 101 can be configured to include one or more features to provide one or more desirable operating functionalities for the active FET 101. For the purpose of description, it will be understood that relative positions above and below are in the example context of the active FET 101 being oriented above the substrate 103 as shown. Accordingly, some or all of the region 105 can be implemented within the substrate 103. Further, it will be understood that the region 105 may or may not overlap with the active FET 101 when viewed from above (e.g., in a plan view).

Figure 2:
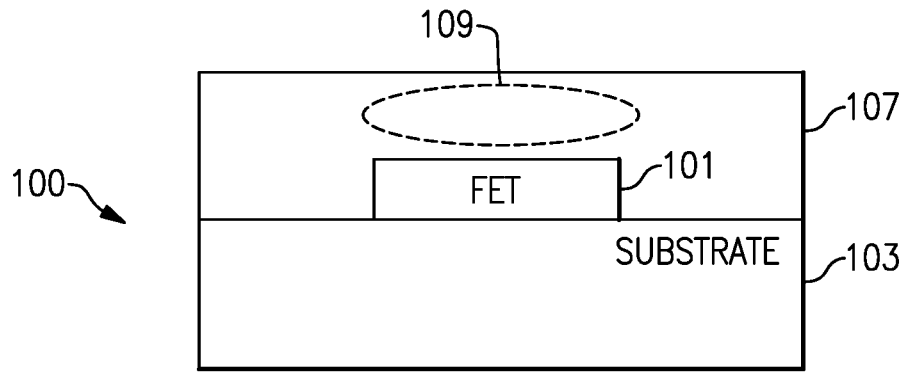
FIG. 2 illustrates an example of a FET device having an active FET implemented on a substrate and having an upper layer implemented over the substrate.

FIG. 2 illustrates an example of a FET device 100 having an active FET 101 implemented on a substrate 103. As described herein, such a substrate can include one or more layers configured to facilitate, for example, operating functionality of the active FET 100, processing functionality for fabrication and support of the active FET 100, etc. For example, if the FET device 100 is implemented as a silicon-on-Insulator (SOI) device, the substrate 103 can include an insulator layer such as a buried oxide (BOX) layer, an interface layer, and a handle wafer layer.

In the example of FIG. 2, the FET device 100 is shown to further include an upper layer 107 implemented over the substrate 103. In some embodiments, such an upper layer can include, for example, a plurality of layers of metal routing features and dielectric layers to facilitate, for example, connectivity functionality for the active FET 100.

FIG. 2 further illustrates that in some embodiments, a region 109 above the active FET 101 can be configured to include one or more features to provide one or more desirable operating functionalities for the active FET 101. Accordingly, some or all of the region 109 can be implemented within the upper layer 107. Further, it will be understood that the region 109 may or may not overlap with the active FET 101 when viewed from above (e.g., in a plan view).

Figure 3:
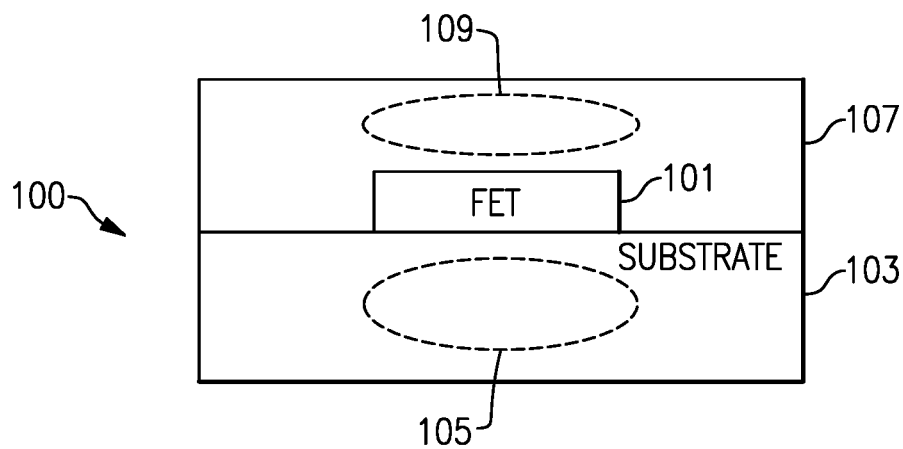
FIG. 3 illustrates another example of a FET device having an active FET implemented on a substrate and having an upper layer implemented over the substrate.

FIG. 3 illustrates an example of a FET device 100 having an active FET 101 implemented on a substrate 103, and also having an upper layer 107. In some embodiments, the substrate 103 can include a region 105 similar to the example of FIG. 1, and the upper layer 107 can include a region 109 similar to the example of FIG. 2.

Examples related to some or all of the configurations of FIGS. 1-3 are described herein in greater detail.

Figure 4:
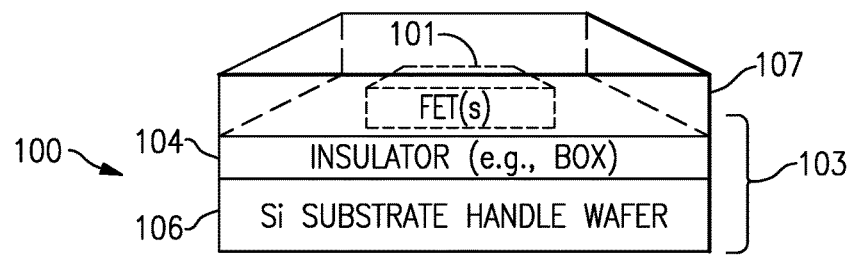
FIG. 4 illustrates an example FET device implemented as an individual SOI unit.
Figure 5:
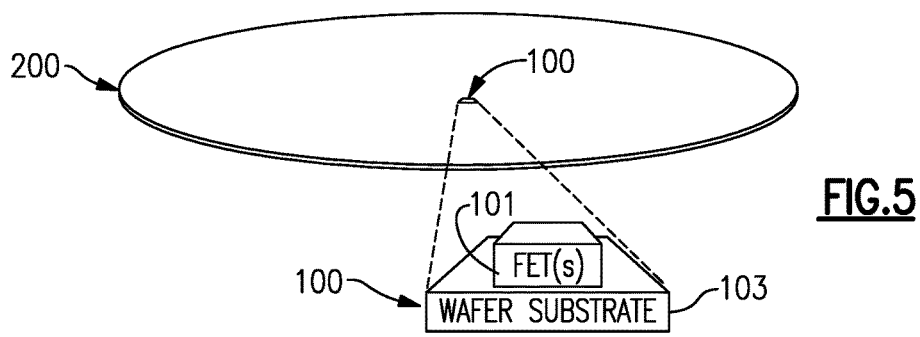
FIG. 5 illustrates a plurality of individual SOI devices similar to the example SOI device of FIG. 4.

In the examples of FIGS. 1-3, the FET devices 100 are depicted as being individual units (e.g., as semiconductor die). FIGS. 4-6 illustrate that in some embodiments, a plurality of FET devices having one or more features as described herein can be fabricated partially or fully in a wafer format, and then be singulated to provide such individual units.

For example, FIG. 4 illustrates an example FET device 100 implemented as an individual SOI unit. Such an individual SOI device can include one or more active FETs 101 implemented over an insulator such as a BOX layer 104 which is itself implemented over a handle layer such as a silicon (Si) substrate handle wafer 106. In the example of FIG. 4, the BOX layer 104 and the Si substrate handle wafer 106 can collectively form the substrate 103 of the examples of FIGS. 1-3, with or without the corresponding region 105.

In the example of FIG. 4, the individual SOI device 100 is shown to further include an upper layer 107. In some embodiments, such an upper layer can be the upper layer 103 of FIGS. 2 and 3, with or without the corresponding region 109.

FIG. 5 illustrates that in some embodiments, a plurality of individual SOI devices similar to the example SOI device 100 of FIG. 4 can be implemented on a wafer 200. As shown, such a wafer can include a wafer substrate 103 that includes a BOX layer 104 and a Si handle wafer layer 106 as described in reference to FIG. 4. As described herein, one or more active FETs can be implemented over such a wafer substrate.

In the example of FIG. 5, the SOI device 100 is shown without the upper layer (107 in FIG. 4). It will be understood that such a layer can be formed over the wafer substrate 103, be part of a second wafer, or any combination thereof.

Figure 6A:
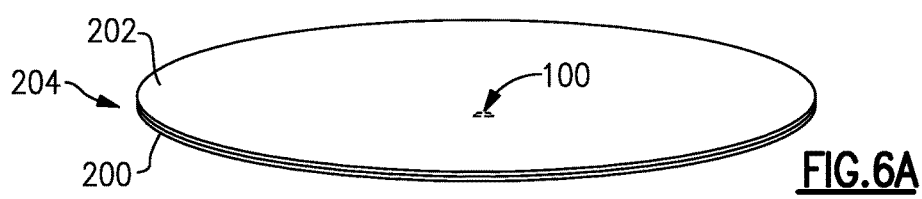
FIG. 6A illustrates an example wafer assembly having a first wafer and a second wafer positioned over the first wafer.
Figure 6B:
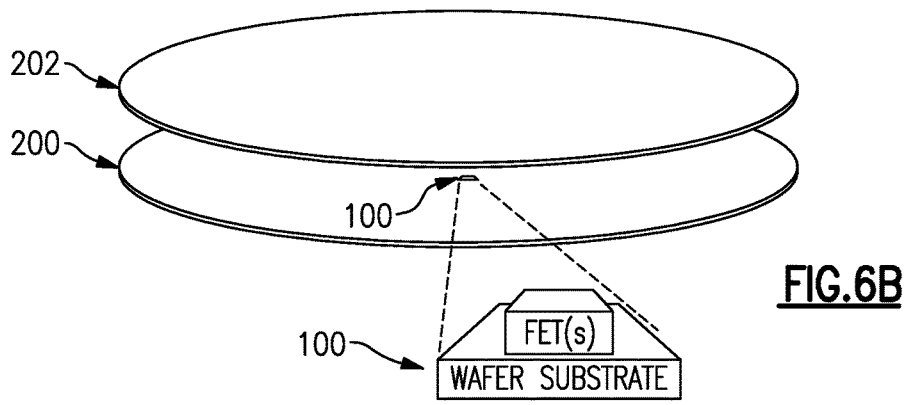
FIG. 6B illustrates an unassembled view of the first and second wafers of the example wafer assembly of FIG. 6A.

FIG. 6A illustrates an example wafer assembly 204 having a first wafer 200 and a second wafer 202 positioned over the first wafer 200. FIG. 6B illustrates an unassembled view of the first and second wafers 200, 202 of the example of FIG. 6A.

In some embodiments, the first wafer 200 can be similar to the wafer 200 of FIG. 5. Accordingly, the first wafer 200 can include a plurality of SOI devices 100 such as the example of FIG. 4. In some embodiments, the second wafer 202 can be configured to provide, for example, a region (e.g., 109 in FIGS. 2 and 3) over a FET of each SOI device 100, and/or to provide temporary or permanent handling wafer functionality for process steps involving the first wafer 200.

Examples of SOI Implementation of FET Devices

Silicon-on-Insulator (SOI) process technology is utilized in many radio-frequency (RF) circuits, including those involving high performance, low loss, high linearity switches. In such RF switching circuits, performance advantage typically results from building a transistor in silicon, which sits on an insulator such as an insulating buried oxide (BOX). The BOX typically sits on a handle wafer, typically silicon, but can be glass, borosilicon glass, fused quartz, sapphire, silicon carbide, or any other electrically-insulating material.

Figure 7:
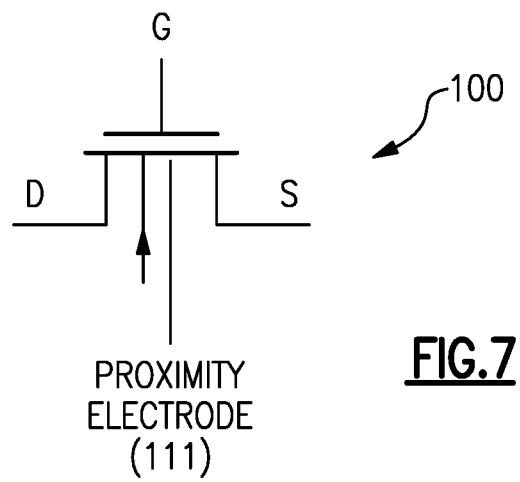
FIG. 7 illustrates a terminal representation of an SOI FET having nodes associated with a gate, a source, a drain, a body, and a proximity electrode.

FIG. 7 illustrates a terminal representation of an SOI FET 100 having nodes associated with a gate, a source, a drain, a body, and a proximity electrode 111. Examples related to such a proximity electrode are described herein in greater detail.

Figure 8:
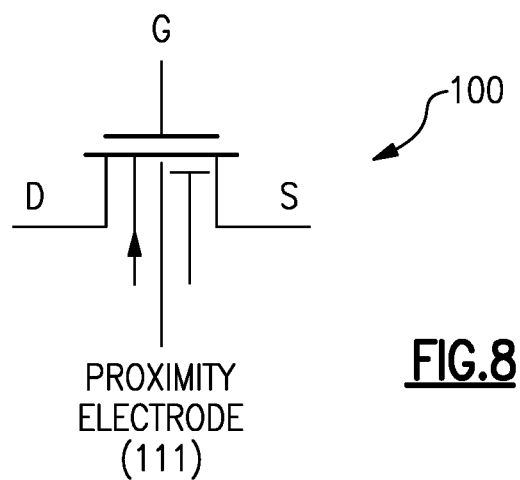
FIG. 8 illustrates a terminal representation of an SOI FET having nodes associated with a gate, a source, a drain, a body, a substrate, and a proximity electrode.

FIG. 8 illustrates that in some embodiments, an SOI FET 100 having a proximity electrode 111 can also include a substrate node. Among others, U.S. Pat. Pub. No. 2016/0322385 published Nov. 3, 2016 and entitled "Substrate bias for field-effect transistor devices," which is expressly incorporated herein by reference in its entirety, discloses additional details about how such a substrate node can be biased and/or coupled to one or more other nodes of the transistor to, for example, improve both linearity and loss performance of the transistor.

Various examples related to the foregoing proximity electrodes are described herein in greater detail. Although various examples are described in the context of RF switches, it will be understood that one or more features of the present disclosure can also be implemented in other applications involving FETs.

Figure 9A:
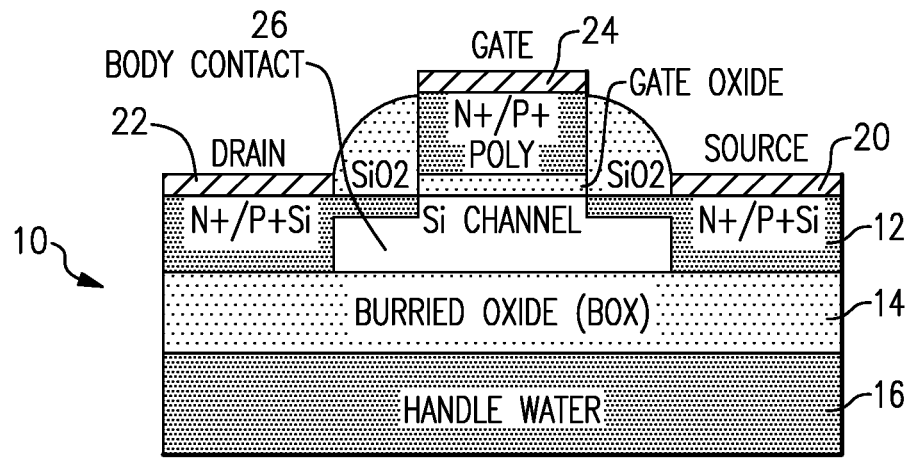
FIGS. 9A and 9B illustrate side sectional and plan views of an example SOI FET device having an active FET implemented over a substrate such as a silicon substrate associated with a handle wafer.
Figure 9B:
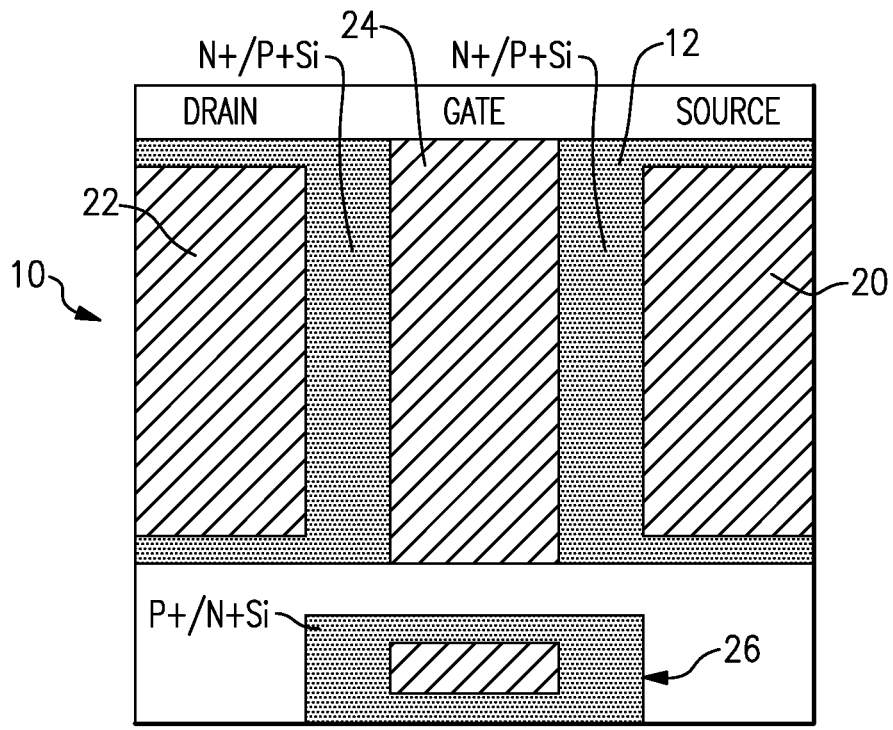

FIGS. 9A and 9B illustrate side sectional and plan views of an example SOI FET device 10 having an active FET implemented over a substrate such as a silicon substrate associated with a handle wafer 16. Although described in the context of such a handle wafer, it will be understood that the substrate does not necessarily need to have functionality associated with a handle wafer.

An insulator layer such as a BOX layer 14 is shown to be formed over the handle wafer 16, and the active FET is shown to be formed based on an active silicon device 12 over the BOX layer 14. In various examples described herein, and as shown in FIGS. 9A and 9B, the active FET can be configured as an NPN or PNP device.

In the example of FIGS. 9A and 9B, terminals for the gate 24, source 20, drain 22 and body 26 are shown to be configured and provided to allow operation of the FET. It will be understood that in some embodiments, the source and the drain can be interchanged.

FIGS. 10-15 illustrate various examples of SOI FET devices 100 each having one or more proximity electrodes 111. In each of such example SOI FET devices, an insulator layer such as a BOX layer 104 is shown to be formed over a silicon (Si) handle wafer layer 106. An active Si layer 12 is shown to be formed over the BOX layer 104. Further, an active Si device (also referred to herein as an active FET, source/gate/drain (S/G/D) assembly) 102 is shown to be formed from the active Si layer. Contact features for the source, gate and drain are shown to be formed on the active FET. It will be understood that one or more metal layers and one or more layers of dielectric along with one or more passivation layers, one or more dielectric layers, or some combination thereof, can be formed to provide electrical connections for such contact features.

Figure 10A:
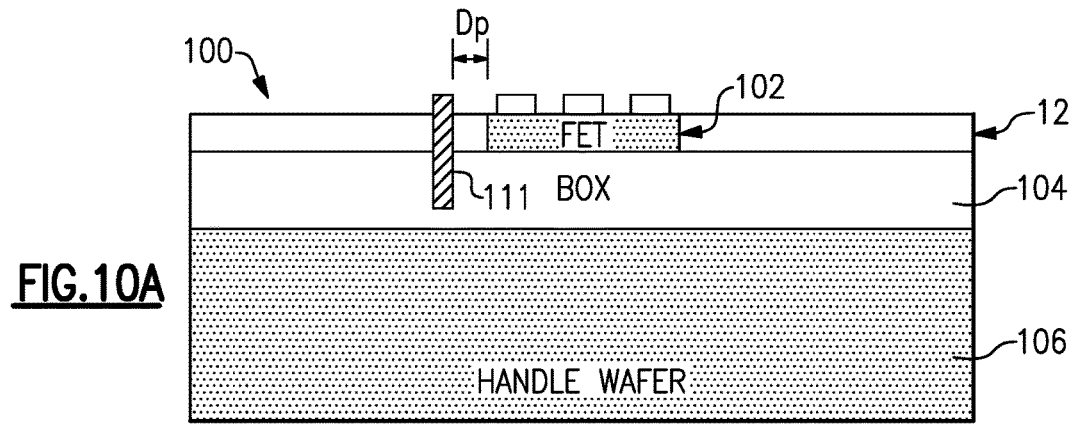
FIGS. 10A, 10B, and 10C illustrate an SOI FET device having one or more proximity electrodes, in which a BOX layer is generally directly above a handle wafer.
Figure 10B:
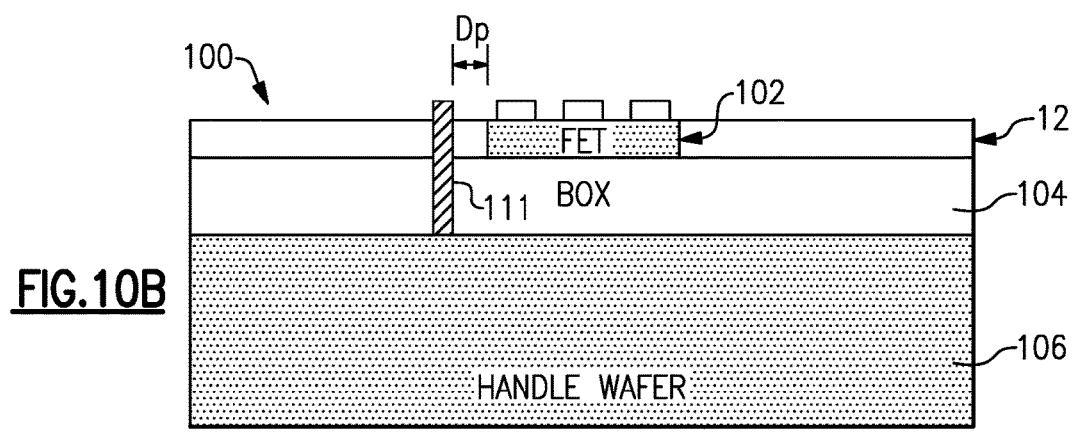
Figure 10C:
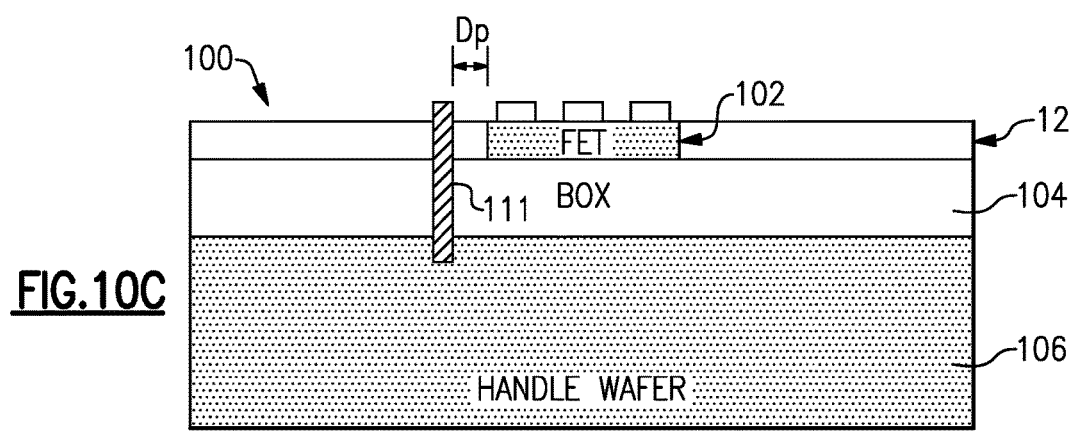

FIGS. 10A-10C illustrate that in some embodiments, one or more proximity electrodes 111 can be implemented in an SOI FET device 100, in which the BOX layer 104 is generally directly above the handle wafer 106. In some embodiments, and as shown in the example of FIG. 10A, a proximity electrode 111 can be implemented so that it extends partially through the BOX layer 104. In some embodiments, and as shown in the example of FIG. 10B, a proximity electrode 111 can be implemented so that it extends substantially through the BOX layer 104 and engages at least the upper boundary surface of the handle wafer 106. In some embodiments, and as shown in the example of FIG. 10C, a proximity electrode 111 can be implemented so that it extends through the BOX layer 104 and partially into the handle wafer 106.

In the examples of FIGS. 10A-10C, the proximity electrode 111 is shown to be laterally offset from the nearest edge of the active FET 102 by a distance of $D_{proximity}$ or Dp. In some embodiments, such a lateral offset distance (Dp) can be, for example, less than 10 μm, 9 μm, 8 μm, 7 μm, 6 μm, 5 μm, 4 μm, 3 μm, 2 μm, or 1 μm. In some embodiments, the lateral offset distance (Dp) can be less than 5 μm. For the purpose of description, it will be understood that such a lateral offset distance (Dp) can be, for example, a distance between the closest portions of the proximity electrode 111 and the corresponding active FET 102 in the active Si layer (12). It will also be understood that the values of Dp in the examples of FIGS. 10A-10C may or may not be the same.

Figure 11A:
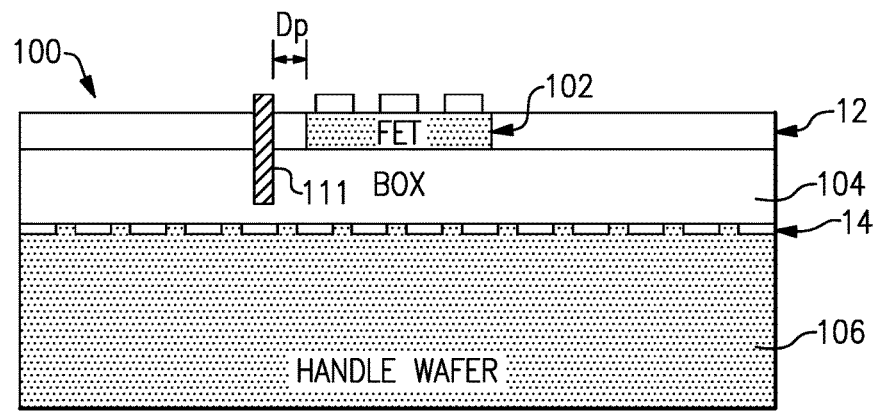
FIGS. 11A, 11B, and 11C illustrate an SOI FET device having one or more proximity electrodes, in which an interface layer such as a trap-rich layer is implemented generally between the BOX layer and the handle wafer.
Figure 11B:
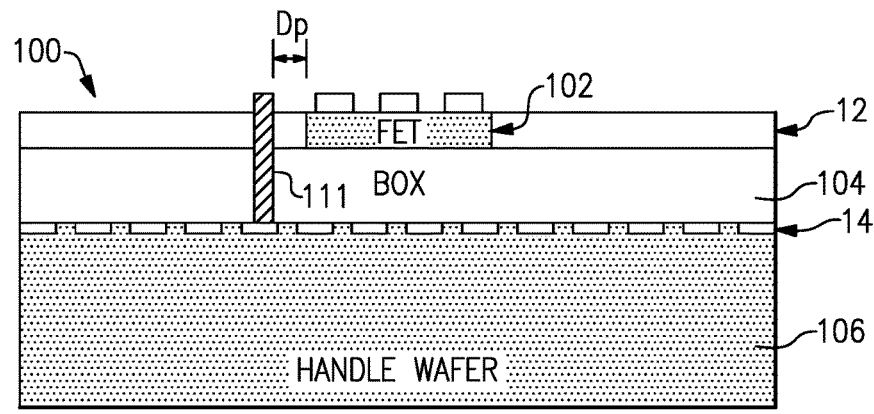
Figure 11C:
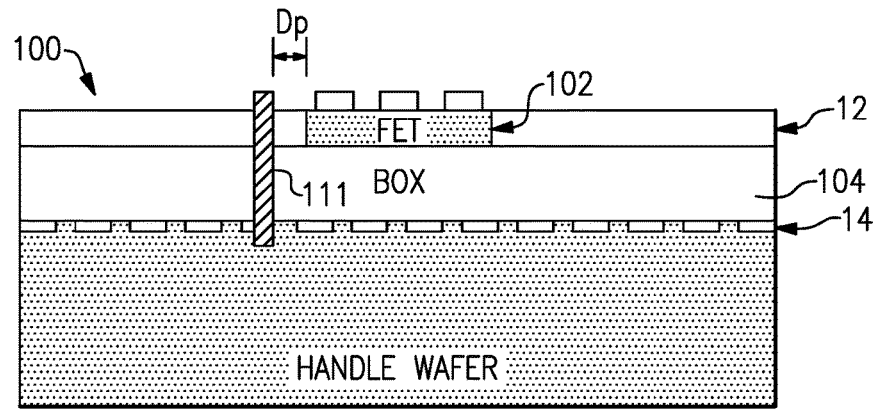

FIGS. 11A-11C illustrate that in some embodiments, one or more proximity electrodes 111 can be implemented in an SOI FET device 100, in which an interface layer such as a trap-rich layer 14 is implemented generally between the BOX layer 104 and the handle wafer 106. In some embodiments, and as shown in the example of FIG. 11A, a proximity electrode 111 can be implemented so that it extends partially through the BOX layer 104. In some embodiments, and as shown in the example of FIG. 11B, a proximity electrode 111 can be implemented so that it extends substantially through the BOX layer 104 and engages at least a portion of the trap-rich layer 14 and/or the upper boundary surface of the handle wafer 106. In some embodiments, and as shown in the example of FIG. 11C, a proximity electrode 111 can be implemented so that it extends through the BOX layer 104 and the trap-rich layer 14, and partially into the handle wafer 106.

In the examples of FIGS. 11A-11C, the proximity electrode 111 is shown to be laterally offset from the nearest edge of the active FET 102 by a distance of $D_{proximity}$ or Dp. In some embodiments, such a lateral offset distance (Dp) can be, for example, less than 10 μm, 9 μm, 8 μm, 7 μm, 6 μm, 5 μm, 4 μm, 3 μm, 2 μm, or 1 μm. In some embodiments, the lateral offset distance (Dp) can be less than 5 μm. For the purpose of description, it will be understood that such a lateral offset distance (Dp) can be, for example, a distance between the closest portions of the proximity electrode 111 and the corresponding active FET 102 in the active Si layer (12). It will also be understood that the values of Dp in the examples of FIGS. 11A-11C may or may not be the same.

Figure 12A:
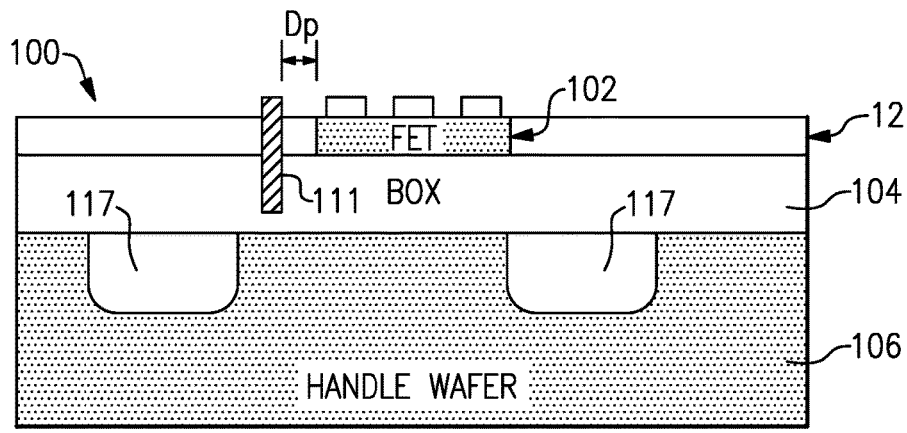
FIGS. 12A, 12B, and 12C illustrate an SOI FET device having one or more proximity electrodes, in which a handle wafer includes a plurality of doped regions implemented to provide one or more functionalities similar to a trap-rich interface layer.
Figure 12B:
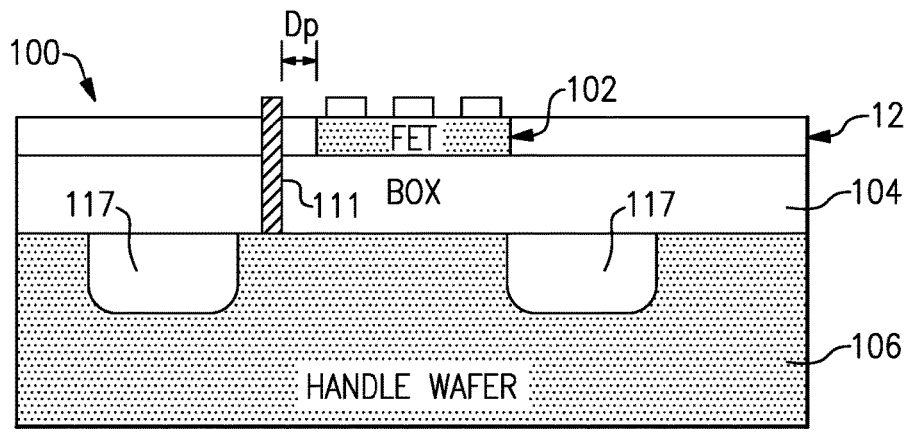
Figure 12C:
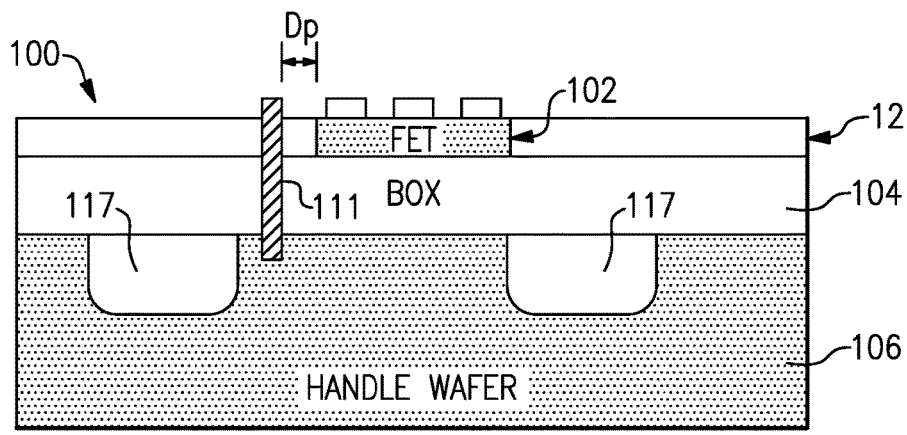

FIGS. 12A-12C illustrate that in some embodiments, one or more proximity electrodes 111 can be implemented in an SOI FET device 100, in which the handle wafer 106 includes a plurality of doped regions 117 implemented to provide one or more functionalities similar to a trap-rich interface layer (e.g., 14 in FIGS. 11A-11C). Such doped regions can be, for example, generally amorphous and have relatively high resistivity when compared to other portions of the handle wafer 106. In some embodiments, and as shown in the example of FIG. 12A, a proximity electrode 111 can be implemented so that it extends partially through the BOX layer 104. In some embodiments, and as shown in the example of FIG. 12B, a proximity electrode 111 can be implemented so that it extends substantially through the BOX layer 104 and engages at least a portion of the upper boundary surface of the handle wafer 106. In some embodiments, and as shown in the example of FIG. 12C, a proximity electrode 111 can be implemented so that it extends through the BOX layer 104 and partially into the handle wafer 106.

In the examples of FIGS. 12A-12C, the proximity electrode 111 is depicted as being laterally positioned between the active FET 102 and the nearest doped region on the corresponding side. Accordingly, each example proximity electrode 111 is shown to not be in contact with the doped region. It will be understood that in some embodiments, a proximity electrode having one or more features as described herein can be configured to be at least partially in contact with a doped region such as the amorphous high-resistivity region 117. In the context of such a proximity electrode extending partially into the handle wafer 106, it will be understood that depth of such an extension can be partially through a depth of the amorphous high-resistivity region 117 or completely through the depth of the amorphous high-resistivity region 117.

In the examples of FIGS. 12A-12C, the proximity electrode 111 is shown to be laterally offset from the nearest edge of the active FET 102 by a distance of $D_{proximity}$ or Dp. In some embodiments, such a lateral offset distance (Dp) can be, for example, less than 10 µm, 9 µm, 8 µm, 7 µm, 6 µm, 5 µm, 4 µm, 3 µm, 2 µm, or 1 µm. In some embodiments, the lateral offset distance (Dp) can be less than 5 µm. For the purpose of description, it will be understood that such a lateral offset distance (Dp) can be, for example, a distance between the closest portions of the proximity electrode 111 and the corresponding active FET 102 in the active Si layer (12). It will also be understood that the values of Dp in the examples of FIGS. 12A-12C may or may not be the same.

Referring to the examples of FIGS. 12A-12C, it is noted that in some embodiments, the proximity electrode 111 can be positioned laterally to be between the active FET 102 and the nearest amorphous high-resistivity region 117 on the side of the proximity electrode 111. In such a configuration, the proximity electrode 111 can be laterally offset from the active FET 102 by any distance, including the foregoing distance ranges.

FIGS. 13-15 illustrate that in some embodiments, an SOI FET device 100 can include a proximity electrode 111 having one or more features as described herein, as well as a substrate contact feature 108. Among others, additional details concerning such a substrate contact feature are disclosed in U.S. Pat. Pub. No. 2016/0322385, which has been incorporated by reference herein.

Figure 13A:
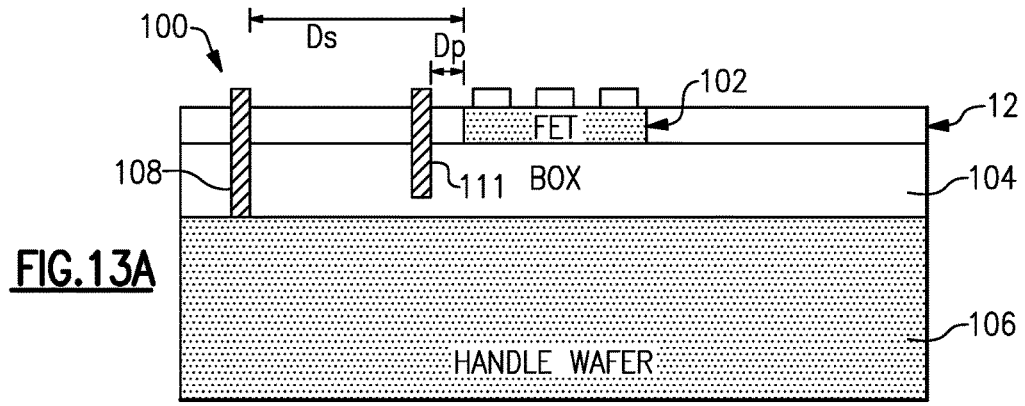
FIGS. 13A, 13B, and 13C illustrate the SOI FET device of FIGS. 10A, 10B, and 10C, in which one or more substrate contact features can be laterally separated from a nearest active FET by a separation distance.
Figure 13B:
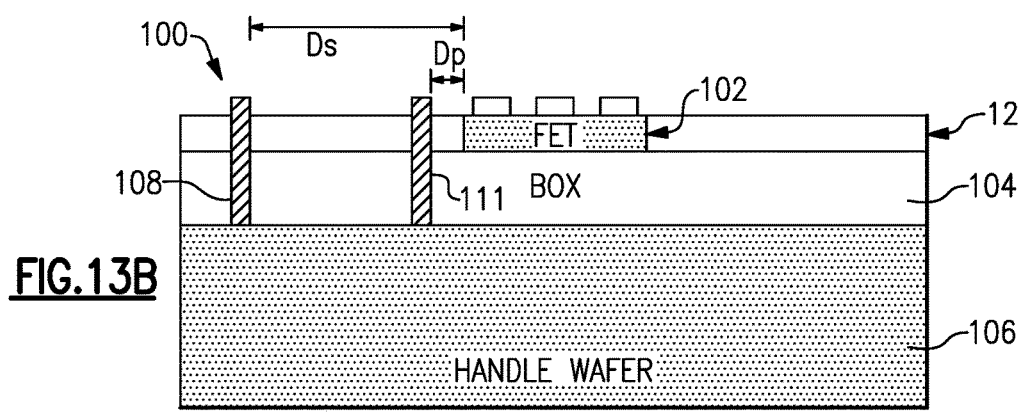
Figure 13C:
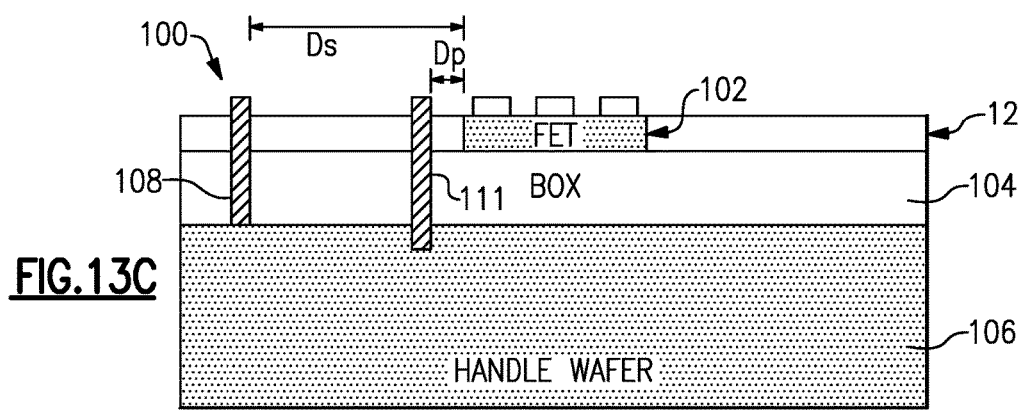

FIGS. 13A-13C illustrate examples that are similar to the examples of FIGS. 10A-10C, but in which one or more substrate contact features 108 can be provided to be laterally separated from the nearest active FET 102 by a separation distance $D_{separation}$ (Ds). In some embodiments, such a separation distance (Ds) of the substrate contact feature 108 can be greater than the lateral offset distance (Dp) of the proximity electrode (Dp) (from the same nearest active FET 102). In such embodiments, the lateral offset distance (Dp) can be, for example, less than 10 µm, 9 µm, 8 µm, 7 µm, 6 µm, 5 µm, 4 µm, 3 µm, 2 µm, or 1 µm. The separation distance (Ds) can be, for example, at least 1 µm, 2 µm, 3 µm, 4 µm, 5 µm, 6 µm, 7 µm, 8 µm, 9 µm, or 10 µm. It will be understood that for a given SOI FET device, the lateral offset distance (Dp) of the proximity electrode 111 and the separation distance (Ds) of the substrate contact feature 108 can be any combination of the foregoing example ranges.

For the purpose of description, it will be understood that the foregoing lateral offset distance (Dp) can be, for example, a distance between the closest portions of the proximity electrode 111 and the corresponding active FET 102 in the active Si layer (12). Similarly, it will be understood that the foregoing separation distance (Ds) can be, for example, a distance between the closest portions of the substrate contact feature 108 and the corresponding active FET 102 in the active Si layer (12). It will also be understood that the values of Dp and Ds in the examples of FIGS. 13A-13C may or may not be the same.

Figure 14A:
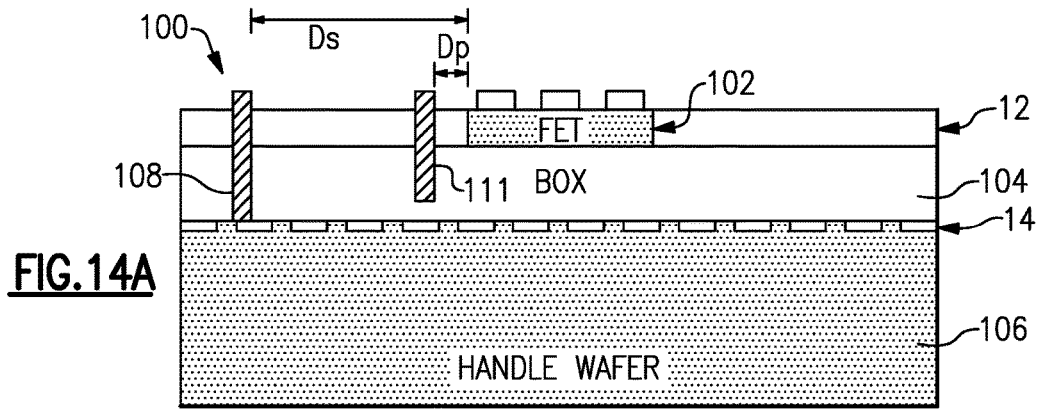
FIGS. 14A, 14B, and 14C illustrate the SOI FET device of FIGS. 11A, 11B, and 11C, in which one or more substrate contact features can be laterally separated from a nearest active FET by a separation distance.
Figure 14B:
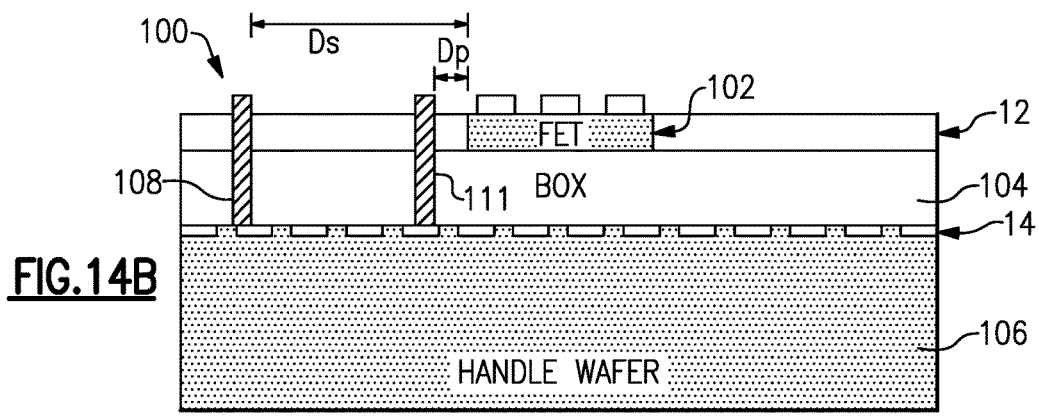
Figure 14C:
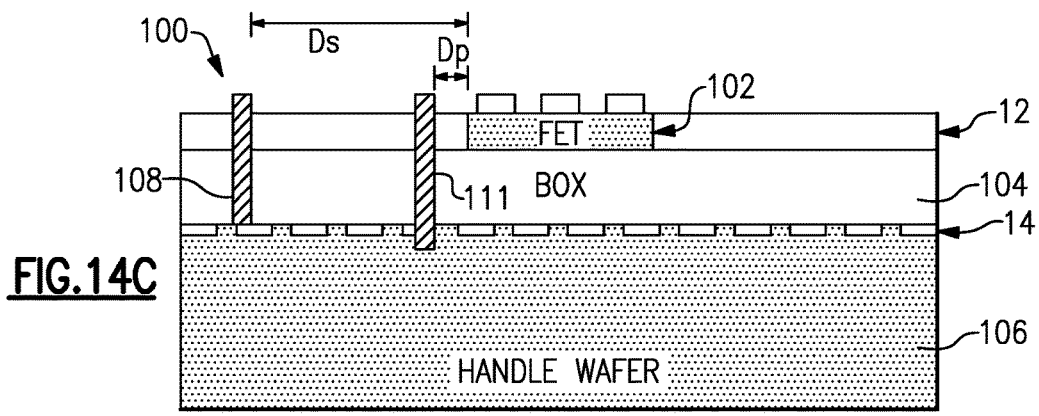

FIGS. 14A-14C illustrate examples that are similar to the examples of FIGS. 11A-11C, but in which one or more substrate contact features 108 can be provided to be laterally separated from the nearest active FET 102 by a separation distance $D_{separation}$ (Ds). In some embodiments, such a separation distance (Ds) of the substrate contact feature 108 can be greater than the lateral offset distance (Dp) of the proximity electrode (Dp) (from the same nearest active FET 102). In such embodiments, the lateral offset distance (Dp) can be, for example, less than 10 µm, 9 µm, 8 µm, 7 µm, 6 µm, 5 µm, 4 µm, 3 µm, 2 µm, or 1 µm. The separation distance (Ds) can be, for example, at least 1 µm, 2 µm, 3 µm, 4 µm, 5 µm, 6 µm, 7 µm, 8 µm, 9 µm, or 10 µm. It will be understood that for a given SOI FET device, the lateral offset distance (Dp) of the proximity electrode 111 and the separation distance (Ds) of the substrate contact feature 108 can be any combination of the foregoing example ranges.

For the purpose of description, it will be understood that the foregoing lateral offset distance (Dp) can be, for example, a distance between the closest portions of the proximity electrode 111 and the corresponding active FET 102 in the active Si layer (12). Similarly, it will be understood that the foregoing separation distance (Ds) can be, for example, a distance between the closest portions of the substrate contact feature 108 and the corresponding active FET 102 in the active Si layer (12). It will also be understood that the values of Dp and Ds in the examples of FIGS. 14A-14C may or may not be the same.

Figure 15A:
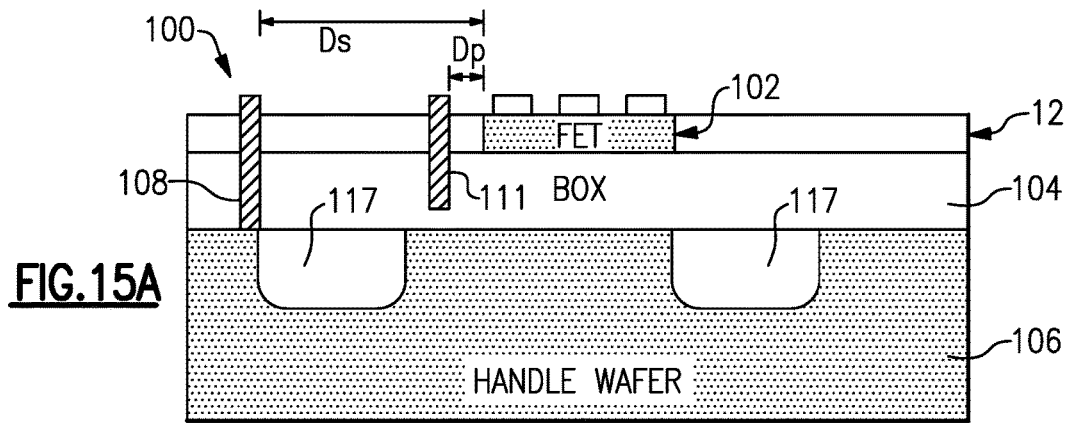
FIGS. 15A, 15B, and 15C illustrate the SOI FET device of FIGS. 12A, 12B, and 12C, in which one or more substrate contact features can be laterally separated from a nearest active FET by a separation distance.
Figure 15B:
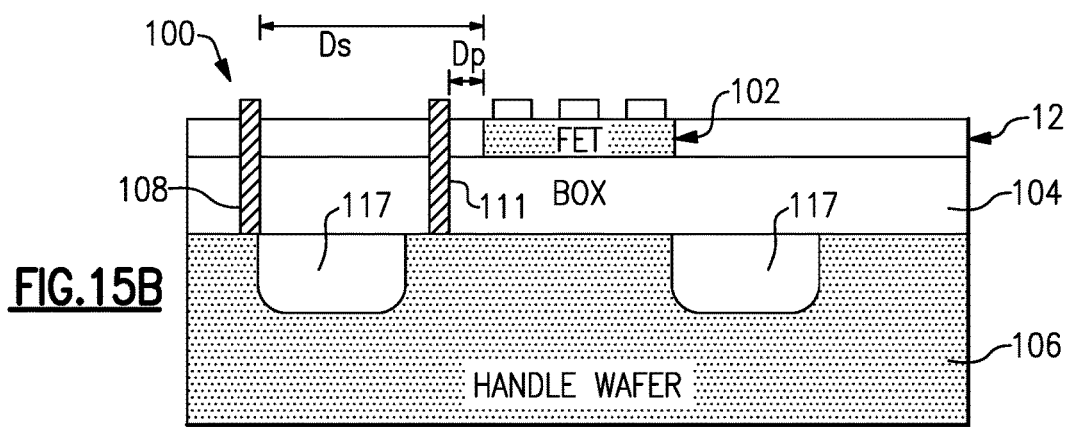
Figure 15C:
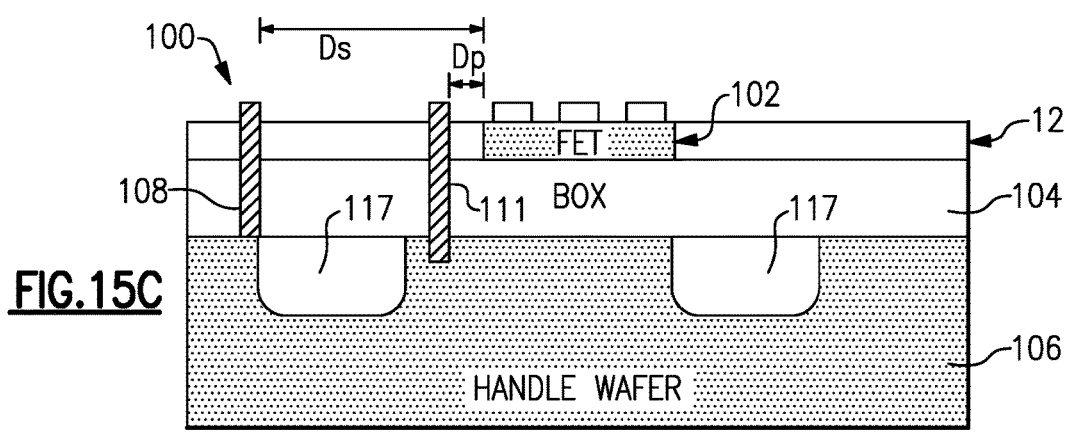

FIGS. 15A-15C illustrate examples that are similar to the examples of FIGS. 12A-12C, but in which one or more substrate contact features 108 can be provided to be laterally separated from the nearest active FET 102 by a separation distance $D_{separation}$ (Ds). In some embodiments, such a separation distance (Ds) of the substrate contact feature 108 can be greater than the lateral offset distance (Dp) of the proximity electrode (Dp) (from the same nearest active FET 102). In such embodiments, the lateral offset distance (Dp) can be, for example, less than 10 µm, 9 µm, 8 µm, 7 µm, 6 µm, 5 µm, 4 µm, 3 µm, 2 µm, or 1 µm. The separation distance (Ds) can be, for example, at least 1 µm, 2 µm, 3 µm, 4 µm, 5 µm, 6 µm, 7 µm, 8 µm, 9 µm, or 10 µm. It will be understood that for a given SOI FET device, the lateral offset distance (Dp) of the proximity electrode 111 and the separation distance (Ds) of the substrate contact feature 108 can be any combination of the foregoing example ranges.

For the purpose of description, it will be understood that the foregoing lateral offset distance (Dp) can be, for example, a distance between the closest portions of the proximity electrode 111 and the corresponding active FET 102 in the active Si layer (12). Similarly, it will be understood that the foregoing separation distance (Ds) can be, for example, a distance between the closest portions of the substrate contact feature 108 and the corresponding active FET 102 in the active Si layer (12). It will also be understood that the values of Dp and Ds in the examples of FIGS. 15A-15C may or may not be the same.

Referring to the examples of FIGS. 15A-15C, it is noted that in some embodiments, the proximity electrode 111 can be positioned laterally to be between the active FET 102 and the nearest amorphous high-resistivity region 117 on the side of the proximity electrode 111, and the substrate contact feature 108 can be positioned laterally to be on the side of the same nearest amorphous high-resistivity region 117 away from the proximity electrode 111 and the active FET 102. In such a configuration, the proximity electrode 111 can be laterally offset from the active FET 102 by any distance, including the foregoing distance ranges. Similarly, the substrate contact feature can be laterally separated from the active FET 102 by any distance, including the foregoing distance ranges.

In some applications, a proximity electrode as described herein can be provided with a signal to form or adjust an operating environment for the corresponding active FET of an SOI FET device. Such a signal can be, for example, a DC voltage to generate an electric field between the proximity electrode and a region generally underneath the active FET, to achieve a desired operating condition for the active FET. It will be understood that other types of signal, such as an AC signal, can also be applied to the proximity electrode to obtain a desired effect relative to the active FET.

Figure 16:
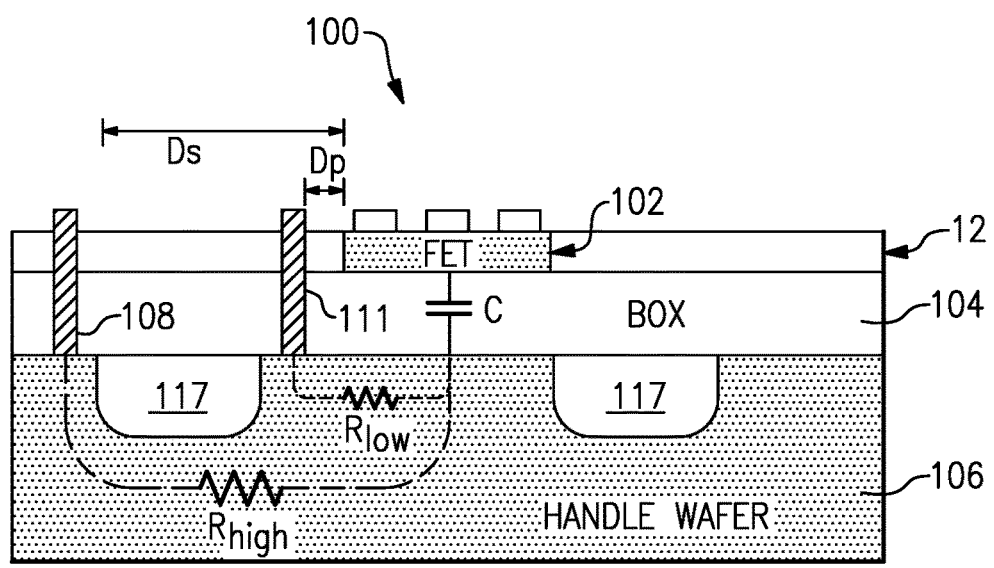
FIG. 16 illustrates an example SOI FET device having a proximity electrode and a BOX layer interposed between an active FET and a handle wafer resulting in a capacitance therebetween.

In some applications, an SOI FET device having the foregoing proximity electrode can be modeled as shown in FIG. 16. The example of FIG. 16 has the same configuration as the example of FIG. 15B.

Referring to FIG. 16, the BOX layer 104 being interposed between the active FET 102 and the handle wafer 106 can result in a capacitance C therebetween. Further, a resistance R can exist between the end of the proximity electrode 111 and the BOX/handle wafer interface. Accordingly, a series RC coupling can be provided between the proximity electrode 111 and the underside of the active FET 102. Thus, such a model coupling can be utilized to obtain a desirable operating environment for the active FET 102.

In the example of FIG. 16, a substrate contact feature 108 is also shown. As described herein, such a substrate contact feature is typically further away from the active FET 102 than the proximity electrode 111. Accordingly, and assuming that the resistivity of the handle wafer 106 is substantially uniform, the resistance ($R_{low}$) between the proximity electrode 111 and the BOX/handle wafer interface is less than the resistance ($R_{high}$) between the substrate contact feature 108 and the BOX/handle wafer interface. Thus, the proximity electrode 111 can be utilized in situations where low resistance coupling is desired, and the substrate contact feature can be utilized in situations where such high resistance coupling is desired.

In the various examples of FIGS. 10-16, a proximity electrode 111 is depicted as being implemented on one side of an active FET 102. It will be understood that in some embodiments, a plurality of proximity electrodes having one or more features as described herein can be implemented on a plurality of locations relative to a given active FET. Further there may be more than one active FET in a given SOI FET device, with each active FET having associated with it one or more proximity electrodes.

Figure 17:
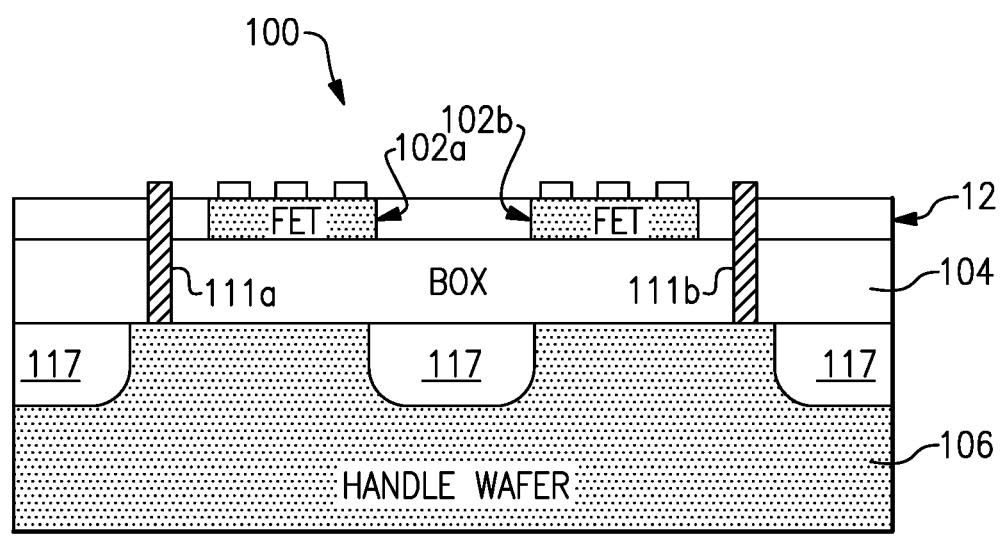
FIG. 17 illustrates an SOI FET device having two active FETs over a BOX layer and a handle wafer.

For example, FIG. 17 illustrates an SOI FET device 100 having two active FETs 102a, 102b over a BOX layer 104 and a handle wafer 106 similar to the example of FIG. 12B. The SOI FET device 100 is shown to include a first proximity electrode 111a implemented close to the first active FET 102a, and a second proximity electrode 111b implemented close to the second active FET 102b.

In some embodiments, a proximity electrode having one or more features as described herein can be implemented as, for example, a conductive via, a conductive trench, or some combination thereof. FIGS. 18 and 19 illustrate examples of how such conductive features can be utilized to form proximity electrodes relative to an active FET 102 (e.g., indicated as an assembly of source, gate and drain (S/G/D)). For the purpose of description, it will be assumed that such an active FET (102) is implemented on an SOI substrate 103, and that a body contact assembly 26 can be implemented as shown.

FIG. 18 illustrates an example of an SOI FET device 100 where a proximity electrode 111 can be implemented as one or more conductive trenches. As described herein, such conductive trench(es) can be laterally offset from the active FET by a desired distance.

FIG. 19 illustrates an example of an SOI FET device 100 where a proximity electrode 111 can be implemented as one or more conductive vias. As described herein, such conductive via(s) can be laterally offset from the active FET by a desired distance.

In some embodiments, a proximity electrode having one or more features as described herein can be utilized to allow formation of one or more couplings with other portions of the corresponding SOI FET device, and/or to allow application of a signal (e.g., a bias signal) to a region proximate the corresponding active FET. U.S. Pat. Pub. No. 2016/0322385 (which has been incorporated by reference herein) discloses a number of examples in which a substrate contact feature (108) can be utilized to couple a substrate to other portion(s) of the corresponding SOI FET device. In some embodiments, similar couplings can be implemented between the proximity electrode and some or all of such other portion(s) of an SOI FET device. In some embodiments having a substrate contact feature (108), a coupling can be implemented between the proximity electrode and the substrate contact feature.

FIGS. 20 and 21 illustrate that in some embodiments, a proximity electrode 111 having one or more features as described herein can be biased with a bias circuit 123. For the purpose of description, an active FET 102 (S/G/D assembly) can have a pattern 121 of one or more proximity electrodes 111 implemented at one or more locations proximate to the active FET 102. It will be understood that such a pattern of proximity electrode(s) can be implemented at one or more discrete locations relative to the active FET 102, be implemented to form a distribution of feature(s) that partially surrounds the active FET 102, be implemented to form a distribution of feature(s) that substantially fully surrounds the active FET 102, or any combination thereof.

As described herein, the bias circuit 123 can be configured to provide a signal to the pattern of proximity electrode(s) 111 to achieve a desired operating condition for the active FET 102. Such a signal can be, for example, a DC voltage or current, an AC voltage or current, or any combination thereof.

FIG. 20 illustrates that in some embodiments, the pattern 121 of proximity electrodes 111 can be implemented for an SOI FET device without a substrate contact feature. FIG. 21 illustrates that in some embodiments, the pattern 121 of proximity electrodes 111 can be implemented for an SOI FET device having a substrate contact feature (depicted as a pattern 170 of one or more substrate contact features 108). Such a pattern of substrate contact feature(s) can be coupled to a substrate bias circuit 152.

Examples Related to Stack Implementations

In some embodiments, a plurality of SOI FET devices can be implemented in a stack configuration. Examples related such a stack configuration can be found in U.S. Pat. Pub. No. 2016/0322385, which has been incorporated by reference herein. FIGS. 22-26 illustrate examples of a stack 300 having a plurality of SOI FET devices 100 arranged in series between first and second nodes 302, 304. Such nodes can be utilized as input and output nodes. It will be understood that other numbers of SOI FET devices can be utilized in a stack.

Figure 22:
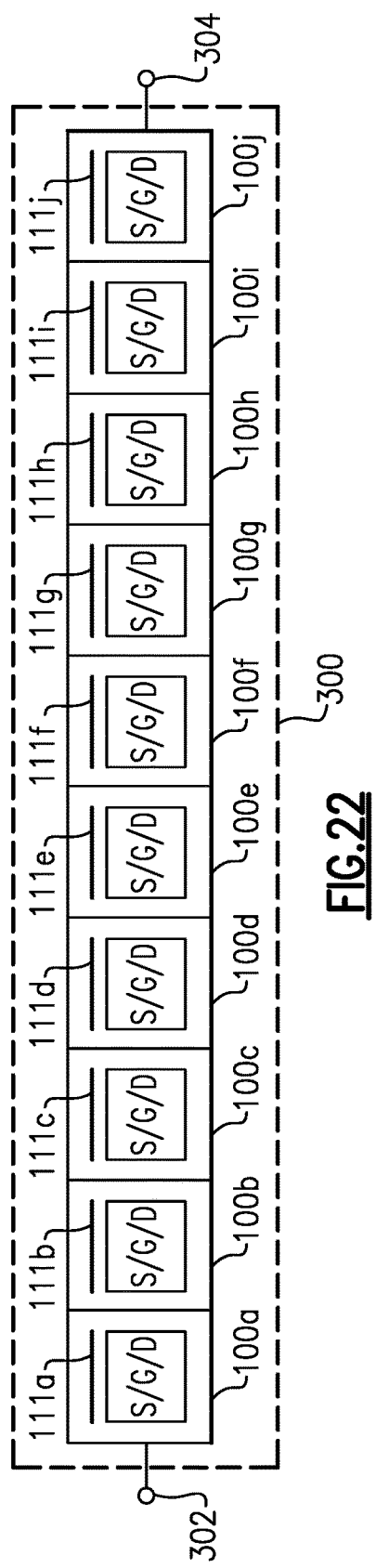
FIG. 22 illustrates an example of a plurality of SOI FET devices implemented in a stack configuration in which each of the SOI FET devices includes a corresponding proximity electrode.

In some embodiments, some or all of the SOI FET devices in a given stack can include a proximity electrode having one or more features as described herein. For example, FIG. 22 illustrates a stack 300 in which each of the ten SOI FET devices 100a-100j includes a corresponding proximity electrode (111a, 111b, . . . , 111i or 111j).

Figure 23:
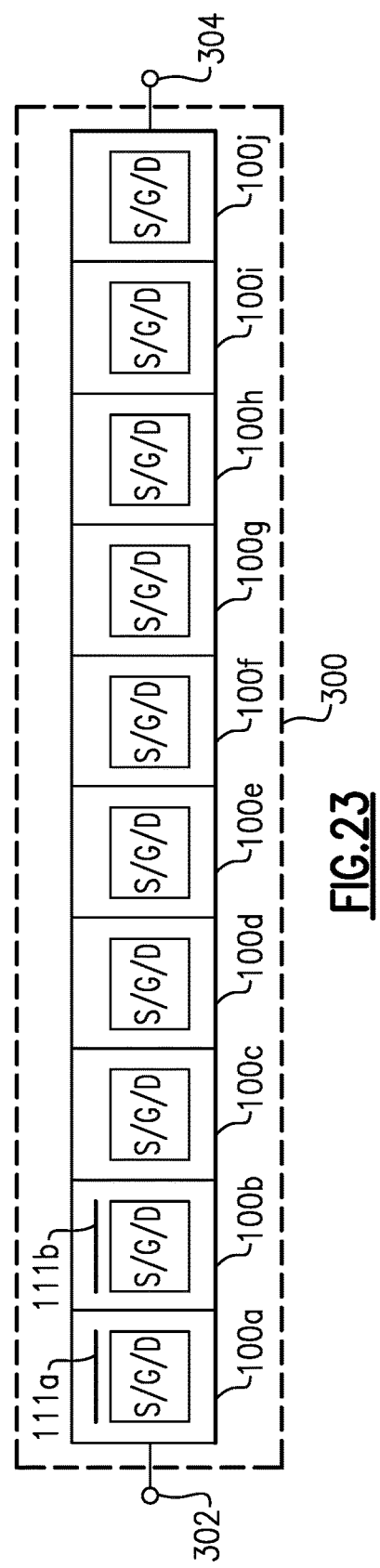
FIG. 23 illustrates an example of a plurality of SOI FET devices implemented in a stack configuration in which a portion of the SOI FET devices include a proximity electrode.

In another example, FIG. 23 illustrates a stack 300 in which only some of the ten SOI FET devices 100a-100j includes a proximity electrode. In the example shown in FIG. 23, the first two SOI FET devices 100a, 100b are shown to include respective proximity electrodes 111a, 111b. It will be understood that other numbers of proximity electrode-equipped SOI FET devices can be implemented in the stack 300. It will also be understood that proximity electrode-equipped SOI FET devices can be implemented at other locations in the stack 300.

FIGS. 24-26 illustrate that in some embodiments, a stack 300 having one or more features as described herein can be biased in different manners. For the purpose of description, the example stacks in FIGS. 24-26 have a proximity electrode 111 for each of the ten SOI FET devices 100a-100j. It will be understood that similar biasing can be implemented with stacks having other configurations of SOI FET devices.

FIG. 24 illustrates that in some embodiments, a common bias signal such as a DC voltage (Vpe) can be provided to each of the proximity electrodes 111a-111j associated with the SOI FET devices 100a-100j.

FIG. 25 illustrates that in some embodiments, a separate bias signal such as a DC voltage can be provided to each of the proximity electrodes 111a-111j associated with the SOI FET devices 100a-100j. For example, V1 can be provided to the first proximity electrode 111a, V2 can be provided to the second proximity electrode 111b, etc. Values of such voltages (V1-V10) may or may not be the same.

FIG. 26 illustrates that in some embodiments, a common bias signal such as a DC voltage can be provided to a group of one or more proximity electrodes. For example, V1 is shown to be provided to the first proximity electrode 111a, V2 is shown to be provided to the second and third proximity electrodes 111b, 111c, V3 is shown to be provided to the fourth, fifth and sixth proximity electrodes 111d-100f, and V4 is shown to be provided to the remaining four proximity electrodes 111g-100j. It will be understood that other configurations can be implemented.

Examples Related to Switching Applications

In some embodiments, an SOI FET device and related devices such as a stack of SOI FET devices can be utilized for switching applications. Among others, U.S. Pat. Pub. No. 2016/0322385, which has been incorporated by reference herein, discloses additional details concerning such switching applications.

Figure 27:
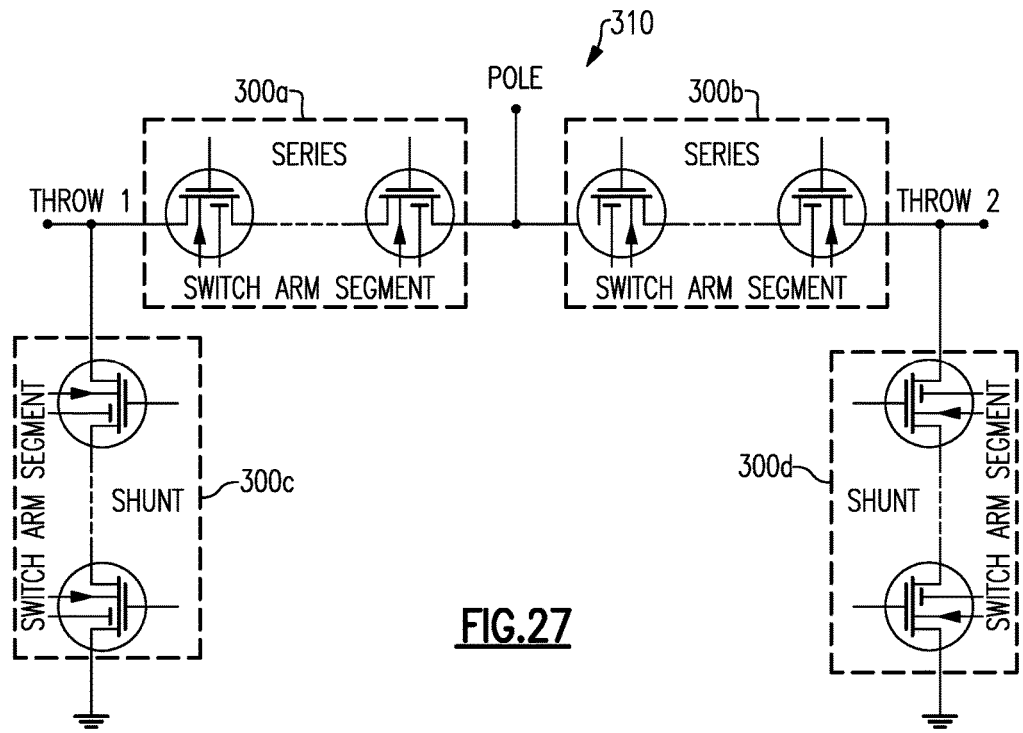
FIG. 27 illustrates an example of how a plurality of stacks can be utilized to form a radio-frequency (RF) switching configuration.

FIG. 27 illustrates an example of how a plurality of stacks 300 can be utilized to form a radio-frequency (RF) switching configuration 310. In such a switching configuration, each of switch arms 300a-300d includes a stack of FET devices. For the purpose of description, each FET in such a stack can be referred to as a FET, the stack itself can be collectively referred to as a FET, or some combination thereof can also be referred to as a FET. In the example of FIG. 27, each FET in the corresponding stack may or may not include a substrate node connection as described in U.S. Pat. Pub. No. 2016/0322385, which has been incorporated by reference herein. In the example of FIG. 27, each of the FTEs is depicted as including a proximity electrode (PE) having one or more features as described herein. It will be understood that in a given stack, and as described herein, not all of the FETs necessarily need to have such proximity electrodes.

Figure 28:
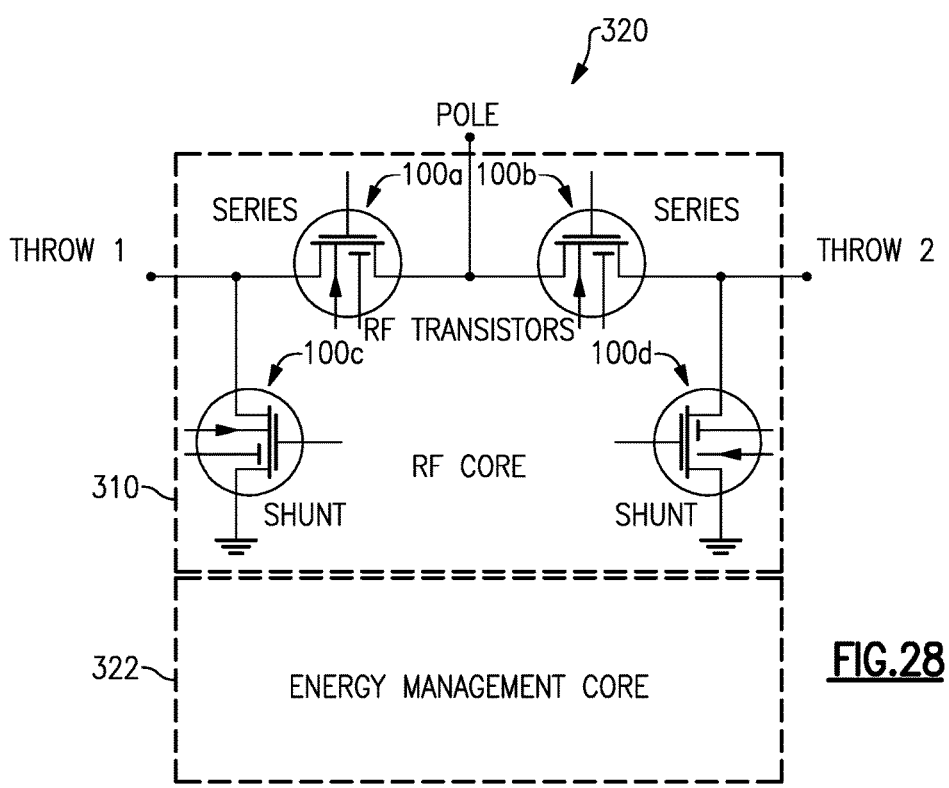
FIG. 28 illustrates an example of an RF switching configuration having an RF core and an energy management (EM) core.

FIG. 28 illustrates an example of an RF switching configuration 320 having an RF core 310 and an energy management (EM) core 322. The EM core 322 can be configured to, for example, facilitate operation of the RF core 310.

The example RF core 310 of FIG. 28 is shown as a single-pole-double-throw (SPDT) configuration in which series arms of transistors 100a, 100b are arranged between a pole and first and second throws, respectively. Nodes associated with the first and second throws are shown to be coupled to ground through their respective shunt arms of transistors 100c, 100d. In some embodiments, the SPDT configuration of the example RD core 310 can be implemented in the example stack configuration 310 of FIG. 27.

As described herein in reference to the examples of FIGS. 27 and 28, FET devices having one or more features of the present disclosure can be utilized to implement an SPDT switch configuration. It will be understood that FET devices having one or more features of the present disclosure can also be implemented in other switch configurations.

Figure 29:
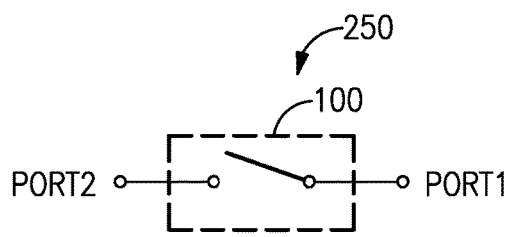
FIG. 29 illustrates a switch assembly implemented in a single-pole-single-throw (SPST) configuration.

FIGS. 29-39 illustrate examples related to various switch configurations that can be implemented utilizing FET devices such as SOI FET devices having one or more features as described herein. For example, FIG. 29 illustrates a switch assembly 250 implemented in a single-pole-single-throw (SPST) configuration. Such a switch can include an SOI FET device 100 implemented between a first port (Port1) and a second port (Port2).

Figure 30:
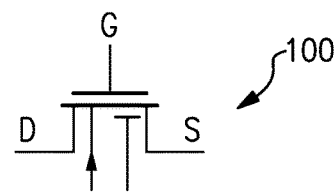
FIG. 30 illustrates the SOI FET device of FIG. 29 with a proximity electrode feature.

FIG. 30 illustrates that in some embodiments, the SOI FET device 100 of FIG. 29 can include a proximity electrode feature as described herein. The source node of the SOI FET device 100 can be connected to the first port (Port1), and the drain node of the SOI FET device 100 can be connected to the second port (Port2). As described herein, the SOI FET device 100 can be turned ON to close the switch 250 (of FIG. 29) between the two ports, and turned OFF to open the switch 250 between the two ports.

It will be understood that the SOI FET device 100 of FIGS. 29 and 30 can include a single FET, or a plurality of FETs arranged in a stack. It will also be understood that each of various SOI FET devices 100 of FIGS. 31-39 can include a single FET, or a plurality of FETs arranged in a stack.

Figure 31:
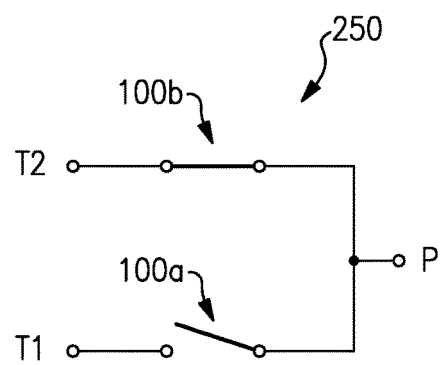
FIG. 31 illustrates an example of how two SPST switches can be utilized to form a switch assembly having a single-pole-double-throw (SPDT) configuration.
Figure 32:
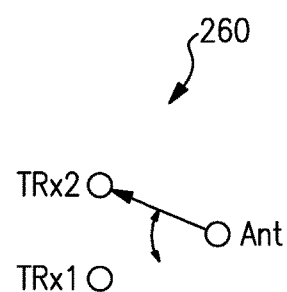
FIG. 32 illustrates, in a SPDT representation, that the switch assembly of FIG. 31 can be utilized in an antenna switch configuration.

FIG. 31 illustrates an example of how two SPST switches (e.g., similar to the examples of FIGS. 29, 30) having one or more features as described herein can be utilized to form a switch assembly 250 having a single-pole-double-throw (SPDT) configuration. FIG. 32 illustrates, in a SPDT representation, that the switch assembly 250 of FIG. 31 can be utilized in an antenna switch configuration 260. It will be understood that one or more features of the present disclosure can also be utilized in switching applications other than antenna switching application.

It is noted that in various switching configuration examples of FIGS. 29-39, switchable shunt paths are not shown for simplified views of the switching configurations. Accordingly, it will be understood that some or all of switchable paths in such switching configurations may or may not have associated with them switchable shunt paths (e.g., similar to the examples of FIGS. 27 and 28).

Referring to the examples of FIGS. 31 and 32, it is noted that such examples are similar to the examples described herein in reference to FIGS. 27 and 28. In some embodiments, the single pole (P) of the switch assembly 250 of FIG. 31 can be utilized as an antenna node (Ant) of the antenna switch 260, and the first and second throws (T1, T2) of the switch assembly 250 of FIG. 31 can be utilized as TRx1 and TRx2 nodes, respectively, of the antenna switch 260. Although each of the TRx1 and TRx2 nodes is indicated as providing transmit (Tx) and receive (Rx) functionalities, it will be understood that each of such nodes can be configured to provide either or both of such Tx and Rx functionalities.

In the examples of FIGS. 31 and 32, the SPDT functionality is shown to be provided by two SPST switches 100a, 100b, with the first SPST switch 100a providing a first switchable path between the pole P (Ant in FIG. 32) and the first throw T1 (TRx1 in FIG. 32), and the second SPST switch 100b providing a second switchable path between the pole P (Ant in FIG. 32) and the second throw T2 (TRx2 in FIG. 32). Accordingly, selective coupling of the pole (Ant) with either of the first throw T1 (TRx1) and the second throw T2 (TRx2) can be achieved by selective switching operations of the first and second SPST switches. For example, if a connection is desired between the pole (Ant) and the first throw T1 (TRx1), the first SPST switch 100a can be closed, and the second SPST switch 100b can be opened. Similarly, and as depicted in the example state in FIGS. 31 and 32, if a connection is desired between the pole (Ant) and the second throw T2 (TRx2), the first SPST switch 100a can be opened, and the second SPST switch 100b can be closed.

In the foregoing switching examples of FIGS. 31 and 32, a single TRx path is connected to the antenna (Ant) node in a given switch configuration. It will be understood that in some applications (e.g., carrier-aggregation applications), more than one TRx paths may be connected to the same antenna node. Thus, in the context of the foregoing switching configuration involving a plurality of SPST switches, more than one of such SPST switches can be closed to thereby connect their respective throws (TRx nodes) to the same pole (Ant).

Figure 33:
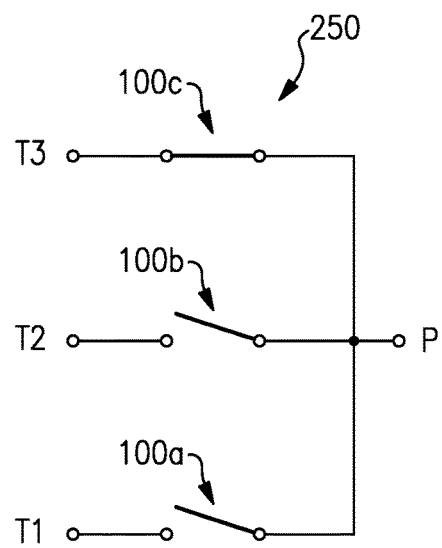
FIG. 33 illustrates an example of how three SPST switches can be utilized to form a switch assembly having a single-pole-triple-throw (SP3T) configuration.
Figure 34:
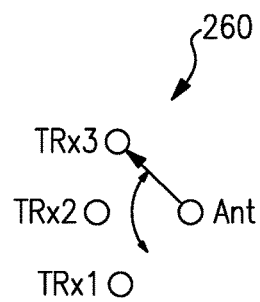
FIG. 34 illustrates, in a SP3T representation, that the switch assembly of FIG. 33 can be utilized in an antenna switch configuration.

FIG. 33 illustrates an example of how three SPST switches (e.g., similar to the examples of FIGS. 29, 30) having one or more features as described herein can be utilized to form a switch assembly 250 having a single-pole-triple-throw (SP3T) configuration. FIG. 34 illustrates, in a SP3T representation, that the switch assembly 250 of FIG. 33 can be utilized in an antenna switch configuration 260. It will be understood that one or more features of the present disclosure can also be utilized in switching applications other than antenna switching application.

Referring to the examples of FIGS. 33 and 34, it is noted that the SP3T configuration can be an extension of the SPDT configuration of FIGS. 29 and 30. For example, the single pole (P) of the switch assembly 250 of FIG. 33 can be utilized as an antenna node (Ant) of the antenna switch 260, and the first, second and third throws (T1, T2, T3) of the switch assembly 250 of FIG. 33 can be utilized as TRx1, TRx2 and TRx3 nodes, respectively, of the antenna switch 260. Although each of the TRx1, TRx2 and TRx3 nodes is indicated as providing transmit (Tx) and receive (Rx) functionalities, it will be understood that each of such nodes can be configured to provide either or both of such Tx and Rx functionalities.

In the examples of FIGS. 33 and 34, the SP3T functionality is shown to be provided by three SPST switches 100a, 100b, 100c, with the first SPST switch 100a providing a first switchable path between the pole P (Ant in FIG. 34) and the first throw T1 (TRx1 in FIG. 34), the second SPST switch 100b providing a second switchable path between the pole P (Ant in FIG. 34) and the second throw T2 (TRx2 in FIG. 34), and the third SPST switch 100c providing a third switchable path between the pole P (Ant in FIG. 34) and the third throw T3 (TRx3 in FIG. 34). Accordingly, selective coupling of the pole (Ant) with one of the first throw T1 (TRx1), the second throw T2 (TRx2), and the third throw T3 (TRx3) can be achieved by selective switching operations of the first, second and third SPST switches. For example, if a connection is desired between the pole (Ant) and the first throw T1 (TRx1), the first SPST switch 100a can be closed, and each of the second and third SPST switches 100b, 100c can be opened. If a connection is desired between the pole (Ant) and the second throw T2 (TRx2), the second SPST switch 100b can be closed, and each of the first and third SPST switches 100a, 100c can be opened. Similarly, and as depicted in the example state in FIGS. 33 and 34, if a connection is desired between the pole (Ant) and the third throw T3 (TRx3), each of the first and second SPST switches 100a, 100b can be opened, and the third SPST switch 100c can be closed.

In the foregoing switching examples of FIGS. 33 and 34, a single TRx path is connected to the antenna (Ant) node in a given switch configuration. It will be understood that in some applications (e.g., carrier-aggregation applications), more than one TRx paths may be connected to the same antenna node. Thus, in the context of the foregoing switching configuration involving a plurality of SPST switches, more than one of such SPST switches can be closed to thereby connect their respective throws (TRx nodes) to the same pole (Ant).

Based on the foregoing examples of SPST, SPDT and SP3T configurations of FIGS. 29-34, one can see that other switching configurations involving a single pole (SP) can be implemented utilizing SOI FET devices having one or more features as described herein. Thus, it will be understood that a switch having a SPNT can be implemented utilizing one or more SOI FET devices as described herein, where the quantity N is a positive integer.

Figure 35:
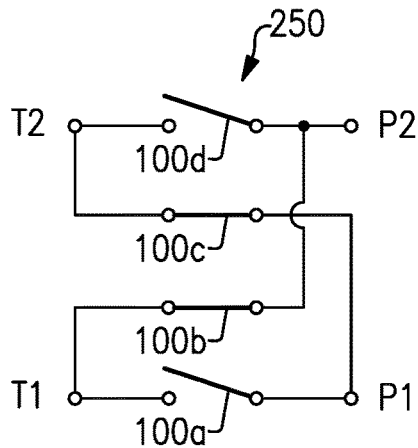
FIG. 35 illustrates an example of how four SPST switches can be utilized to form a switch assembly having a double-pole-double-throw (DPDT) configuration.
Figure 36:
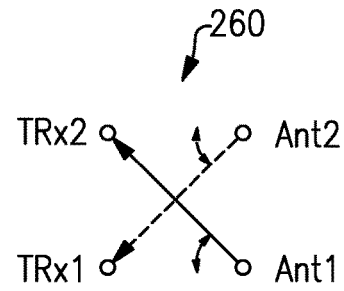
FIG. 36 illustrates, in a DPDT representation, that the switch assembly of FIG. 35 can be utilized in an antenna switch configuration.
Figure 37:
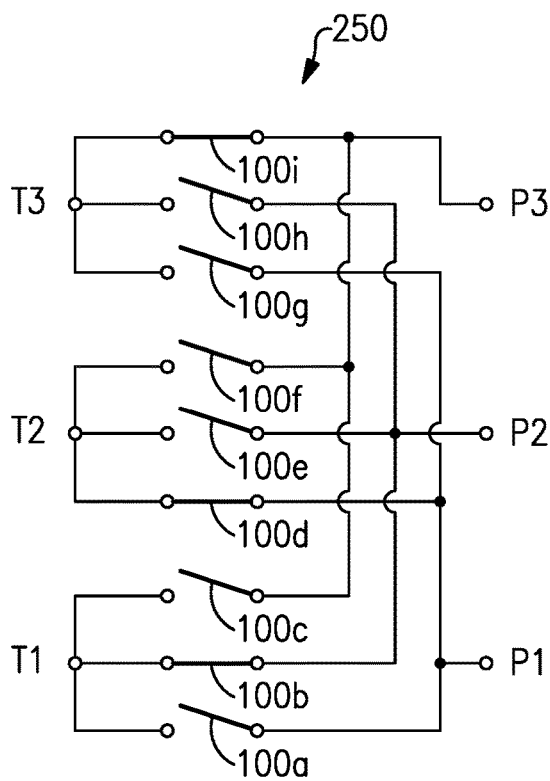
FIG. 37 illustrates an example of how nine SPST switches can be utilized to form a switch assembly having a triple-pole-triple-throw (3P3T) configuration.
Figure 38:
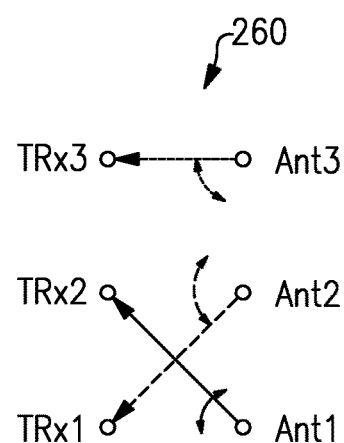
FIG. 38 illustrates, in a 3P3T representation, that the switch assembly of FIG. 37 can be utilized in an antenna switch configuration.

Switching configurations of FIGS. 31-34 are examples where a single pole (SP) is connectable to one or more of a plurality of throws to yield the foregoing SPNT functionality. FIGS. 35-38 illustrate examples where more than one poles can be provided in switching configurations. FIGS. 35 and 36 illustrate examples related to a double-pole-double-throw (DPDT) switching configuration that can utilize a plurality of SOI FET devices having one or more features as described herein. Similarly, FIGS. 37 and 38 illustrate examples related to a triple-pole-triple-throw (3P3T) switching configuration that can utilize a plurality of SOI FET devices having one or more features as described herein.

It will be understood that a switching configuration utilizing a plurality of SOI FET devices having one or more features as described herein can include more than three poles. Further, it is noted that in the examples of FIGS. 35-38, the number of throws (e.g., 2 in FIGS. 35 and 36, and 3 in FIGS. 37 and 38) are depicted as being the same as the corresponding number of poles for convenience. However, it will be understood that the number of throws may be different than the number of poles.

FIG. 35 illustrates an example of how four SPST switches (e.g., similar to the examples of FIGS. 29, 30) having one or more features as described herein can be utilized to form a switch assembly 250 having a DPDT configuration. FIG. 36 illustrates, in a DPDT representation, that the switch assembly 250 of FIG. 35 can be utilized in an antenna switch configuration 260. It will be understood that one or more features of the present disclosure can also be utilized in switching applications other than antenna switching application.

In the examples of FIGS. 35 and 36, the DPDT functionality is shown to be provided by four SPST switches 100a, 100b, 100c, 100d. The first SPST switch 100a is shown to provide a switchable path between a first pole P1 (Ant1 in FIG. 36) and a first throw T1 (TRx1 in FIG. 36), the second SPST switch 100b is shown to provide a switchable path between a second pole P2 (Ant2 in FIG. 36) and the first throw T1 (TRx1 in FIG. 36), the third SPST switch 100c is shown to provide a switchable path between the first pole P1 (Ant1 in FIG. 36) and a second throw T2 (TRx2 in FIG. 36), and the fourth SPST switch 100d is shown to provide a switchable path between the second pole P2 (Ant2 in FIG. 36) and the second throw T2 (TRx2 in FIG. 36). Accordingly, selective coupling between one or more of the poles (antenna nodes) with one or more of the throws (TRx nodes) can be achieved by selective switching operations of the four SPST switches 100a, 100b, 100c, 100d. Examples of such switching operations are described herein in greater detail.

FIG. 37 illustrates an example of how nine SPST switches (e.g., similar to the examples of FIGS. 29, 30) having one or more features as described herein can be utilized to form a switch assembly 250 having a 3P3T configuration. FIG. 38 illustrates, in a 3P3T representation, that the switch assembly 250 of FIG. 37 can be utilized in an antenna switch configuration 260. It will be understood that one or more features of the present disclosure can also be utilized in switching applications other than antenna switching application.

Referring to the examples of FIGS. 37 and 38, it is noted that the 3P3T configuration can be an extension of the DPDT configuration of FIGS. 35 and 36. For example, a third pole (P3) can be utilized as a third antenna node (Ant3), and a third throw (T3) can be utilized as a third TRx node (TRx3). Connectivity associated with such third pole and third throw can be implemented similar to the examples of FIGS. 35 and 36.

In the examples of FIGS. 37 and 38, the 3P3T functionality is shown to be provided by nine SPST switches 100a-100i. Such nine SPST switches can provide switchable paths as listed in Table 1.

TABLE 1

| SPST switch | Pole | Throw |
| --- | --- | --- |
| 100a | P1 | T1 |
| 100b | P2 | T1 |
| 100c | P3 | T1 |
| 100d | P1 | T2 |
| 100e | P2 | T2 |
| 100f | P3 | T2 |
| 100g | P1 | T3 |
| 100h | P2 | T3 |
| 100i | P3 | T3 |

Based on the example of FIGS. 37 and 38, and Table 1, one can see that selective coupling between one or more of the poles (antenna nodes) with one or more of the throws (TRx nodes) can be achieved by selective switching operations of the nine SPST switches 100a-100i.

In many applications, switching configurations having a plurality of poles and a plurality of throws can provide increased flexibility in how RF signals can be routed therethrough. FIGS. 39A-39E illustrate examples of how a DPDT switching configuration such as the examples of FIGS. 35 and 36 can be operated to provide different signal routing functionalities. It will be understood that similar control schemes can also be implemented for other switching configurations, such as the 3P3T examples of FIGS. 37 and 38.

In some wireless front-end architectures, two antennas can be provided, and such antennas can operate with two channels, with each channel being configured for either or both of Tx and Rx operations. For the purpose of description, it will be assumed that each channel is configured for both Tx and Rx operations (TRx). However, it will be understood that each channel does not necessarily need to have such TRx functionality. For example, one channel can be configured for TRx operations, while the other channel can be configured for Rx operation. Other configurations are also possible.

In the foregoing front-end architectures, there may be relatively simple switching states including a first state and a second state. In the first state, the first TRx channel (associated with the node TRx1) can operate with the first antenna (associated with the node Ant1), and the second TRx channel (associated with the node TRx2) can operate with the second antenna (associated with the node Ant2). In the second state, connections between the antenna nodes and the TRx nodes can be swapped from the first state. Accordingly, the first TRx channel (associated with the node TRx1) can operate with the second antenna (associated with the node Ant2), and the second TRx channel (associated with the node TRx2) can operate with the first antenna (associated with the node Ant1).

In some embodiments, such two states of the DPDT switching configuration can be controlled by a one-bit logic scheme, as shown in the example logic states in Table 2.

TABLE 2

| State | Control logic | TRx1-Ant1 connection | TRx1-Ant2 connection | TRx2-Ant1 connection | TRx2-Ant2 connection |
| --- | --- | --- | --- | --- | --- |
| 1 | 0 | Yes | No | No | Yes |
| 2 | 1 | No | Yes | Yes | No |

Figure 39A:
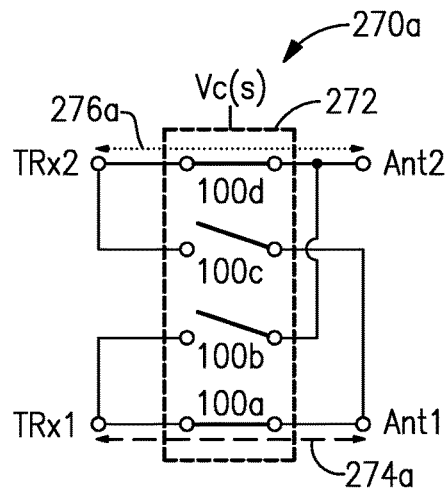
FIGS. 39A, 39B, 39C, 39D, and 39E illustrate examples of how a DPDT switching configuration such as the examples of FIGS. 35 and 36 can be operated to provide different signal routing functionalities.
Figure 39B:
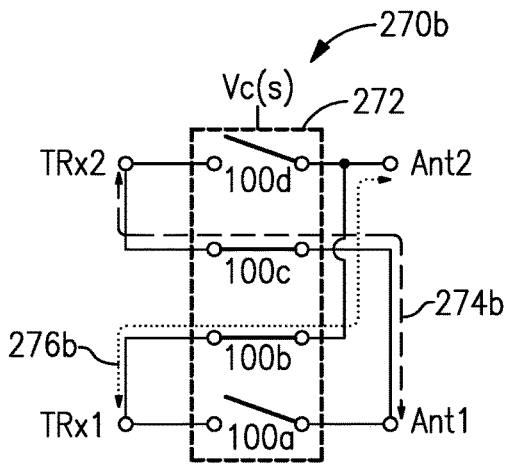

The first state (State 1) of the example of Table 2 is depicted in FIG. 39A as 270a, where the TRx1-Ant1 connection is indicated as path 274a, and the TRx2-Ant2 connection is indicated as path 276a. A control signal, representative of the control logic of Table 2, provided to the assembly (272) of the four SPST switches (100a, 100b, 100c, 100d) is collectively indicated as Vc(s). Similarly, the second state (State 2) of the example of Table 2 is depicted in FIG. 39B as 270b, where the TRx1-Ant2 connection is indicated as path 276b, and the TRx2-Ant1 connection is indicated as path 274b.

In some front-end architectures having a DPDT switching configuration, it may be desirable to have additional switching states. For example, it may be desirable to have only one path active among the two TRx channels and the two antennas. In another example, it may be desirable to disable all signal paths through the DPDT switch. Examples of 3-bit control logic that can be utilized to achieve such examples switching states are listed in Table 3.

TABLE 3

| State | Control logic (Vc1, Vc2, Vc3) | TRx1-Ant1 connection | TRx1-Ant2 connection | TRx2-Ant1 connection | TRx2-Ant2 connection |
| --- | --- | --- | --- | --- | --- |
| 1 | 0, 0, 0 | No | No | No | No |
| 2 | 0, 0, 1 | Yes | No | No | Yes |
| 3 | 0, 1, 0 | Yes | No | No | No |
| 4 | 0, 1, 1 | No | Yes | Yes | No |
| 5 | 1, 0, 0 | No | Yes | No | No |

Figure 39C:
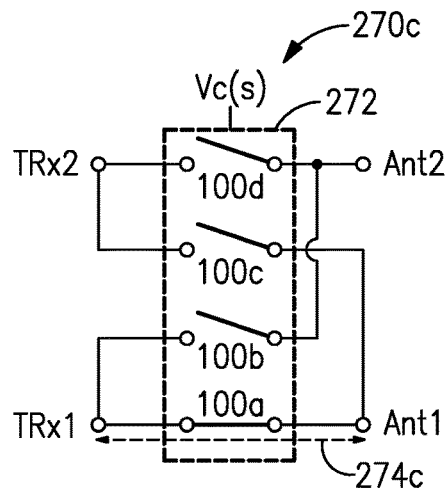
Figure 39D:
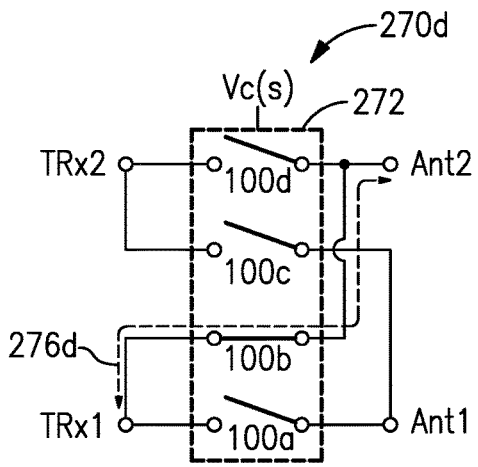
Figure 39E:
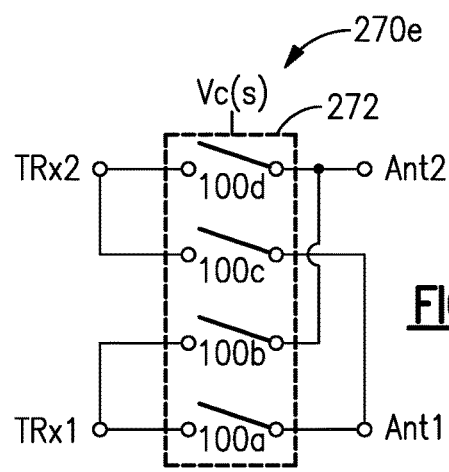

The first state (State 1) of the example of Table 3 is depicted in FIG. 39E as 270e, where all of the TRx-Ant paths are disconnected. A control signal indicated as Vc(s) in FIG. 39E and as listed in Table 3 can be provided to the assembly (272) of the four SPST switches (100a, 100b, 100c, 100d) to effectuate such a switching state.

The second state (State 2) of the example of Table 3 is depicted in FIG. 39A as 270a, where the TRx1-Ant1 connection is indicated as path 274a, and the TRx2-Ant2 connection is indicated as path 276a. A control signal indicated as Vc(s) in FIG. 39A and as listed in Table 3 can be provided to the assembly (272) of the four SPST switches (100a, 100b, 100c, 100d) to effectuate such a switching state.

The third state (State 3) of the example of Table 3 is depicted in FIG. 39C as 270c, where the TRx1-Ant1 connection is indicated as path 274c, and all other paths are disconnected. A control signal indicated as Vc(s) in FIG.

39C and as listed in Table 3 can be provided to the assembly (272) of the four SPST switches (100a, 100b, 100c, 100d) to effectuate such a switching state.

The fourth state (State 4) of the example of Table 3 is depicted in FIG. 39B as 270b, where the TRx1-Ant2 connection is indicated as path 276b, and the TRx2-Ant1 connection is indicated as path 274b. A control signal indicated as Vc(s) in FIG. 39B and as listed in Table 3 can be provided to the assembly (272) of the four SPST switches (100a, 100b, 100c, 100d) to effectuate such a switching state.

The fifth state (State 5) of the example of Table 3 is depicted in FIG. 39D as 270d, where the TRx1-Ant2 connection is indicated as path 276d, and all other paths are disconnected. A control signal indicated as Vc(s) in FIG. 39D and as listed in Table 3 can be provided to the assembly (272) of the four SPST switches (100a, 100b, 100c, 100d) to effectuate such a switching state.

As one can see, other switching configurations can also be implemented with the DPDT switch of FIGS. 39A-39E. It will also be understood that other switches such as 3P3T of FIGS. 37 and 38 can be controlled by control logic in a similar manner.

Examples Related to Implementations in Products

Various examples of SOI FET devices, circuits based on such devices, and bias/coupling configurations for such devices and circuits as described herein can be implemented in a number of different ways and at different product levels. Some of such product implementations are described by way of examples.

Figure 40A:
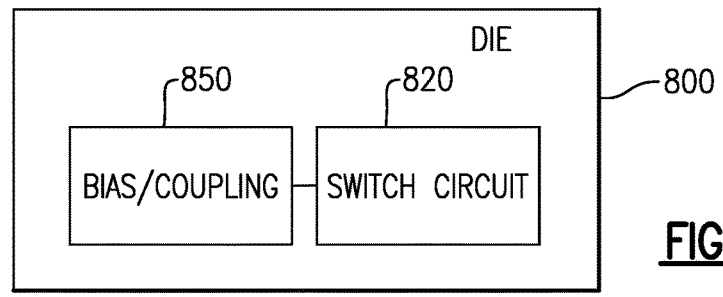
FIGS. 40A, 40B, 40C, and 40D illustrate examples of SOI FET devices as described herein implemented on one or more semiconductor die.
Figure 40B:
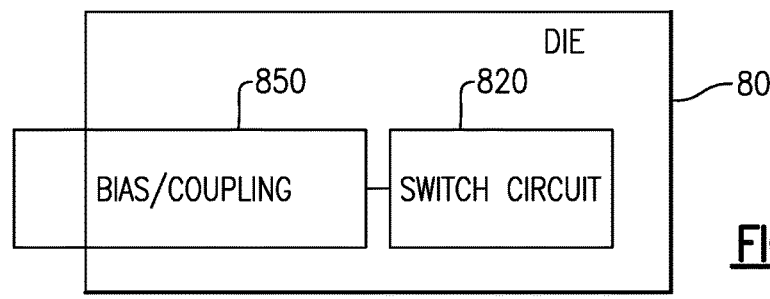

FIGS. 40A-40D depict non-limiting examples of such implementations on one or more semiconductor die. FIG. 40A illustrates that in some embodiments, a switch circuit 820 and a bias/coupling circuit 850 having one or more features as described herein can be implemented on a die 800. FIG. 40B illustrates that in some embodiments, at least some of the bias/coupling circuit 850 can be implemented outside of the die 800 of FIG. 40A.

Figure 40C:
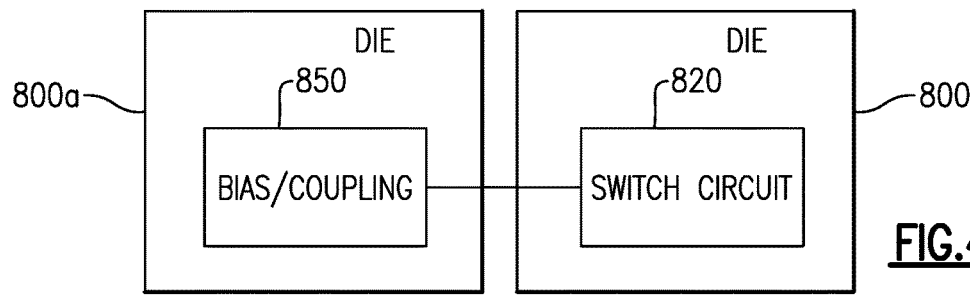
Figure 40D:
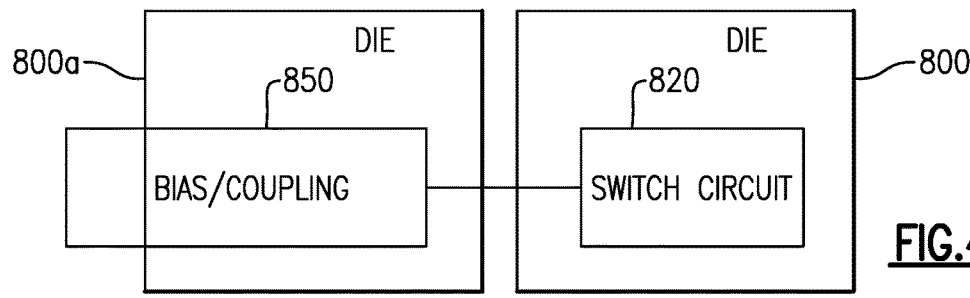

FIG. 40C illustrates that in some embodiments, a switch circuit 820 having one or more features as described herein can be implemented on one die 800b, and a bias/coupling circuit 850 having one or more features as described herein can be implemented on another die 800a. FIG. 40D illustrates that in some embodiments, at least some of the bias/coupling circuit 850 can be implemented outside of the other die 800a of FIG. 40C.

Figure 41A:
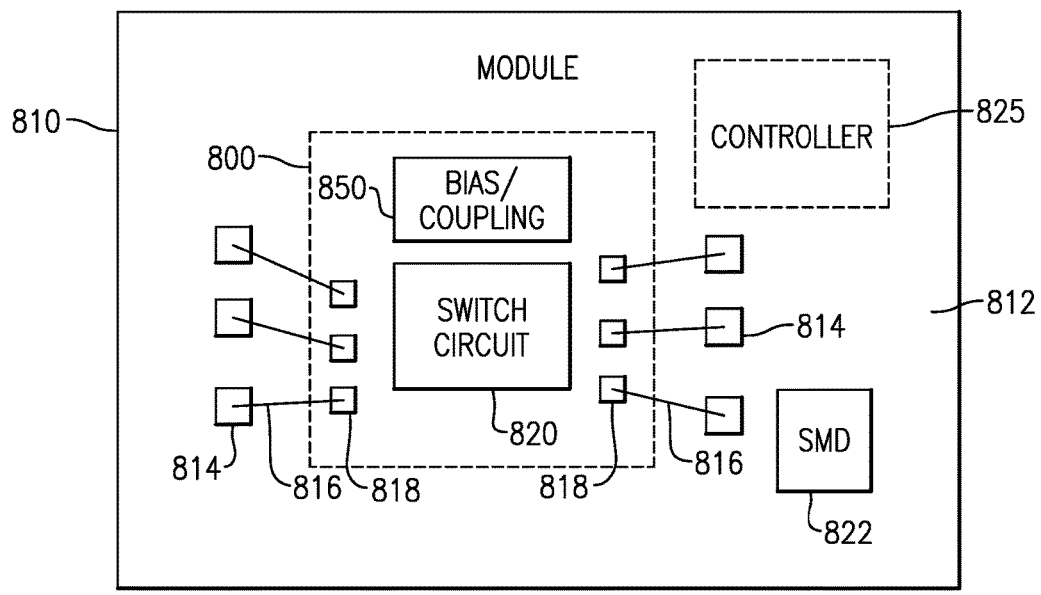
FIGS. 41A and 41B illustrate packaged modules having one or more dies that include SOI FET devices as described herein.

In some embodiments, one or more die having one or more features described herein can be implemented in a packaged module. An example of such a module is shown in FIGS. 41A (plan view) and 41B (side view). Although described in the context of both of the switch circuit and the bias/coupling circuit being on the same die (e.g., example configuration of FIG. 40A), it will be understood that packaged modules can be based on other configurations.

A module 810 is shown to include a packaging substrate 812. Such a packaging substrate can be configured to receive a plurality of components, and can include, for example, a laminate substrate. The components mounted on the packaging substrate 812 can include one or more die. In the example shown, a die 800 having a switching circuit 820 and a bias/coupling circuit 850 is shown to be mounted on the packaging substrate 812. The die 800 can be electrically connected to other parts of the module (and with each other where more than one die is utilized) through connections such as connection-wirebonds 816. Such connection-wirebonds can be formed between contact pads 818 formed on the die 800 and contact pads 814 formed on the packaging substrate 812. In some embodiments, one or more surface mounted devices (SMDs) 822 can be mounted on the packaging substrate 812 to facilitate various functionalities of the module 810.

In some embodiments, the packaging substrate 812 can include electrical connection paths for interconnecting the various components with each other and/or with contact pads for external connections. For example, a connection path 832 is depicted as interconnecting the example SMD 822 and the die 800. In another example, a connection path 833 is depicted as interconnecting the SMD 822 with an external-connection contact pad 834. In yet another example a connection path 835 is depicted as interconnecting the die 800 with ground-connection contact pads 836.

In some embodiments, a space above the packaging substrate 812 and the various components mounted thereon can be filled with an overmold structure 830. Such an overmold structure can provide a number of desirable functionalities, including protection for the components and wirebonds from external elements, and easier handling of the packaged module 810.

Figure 41B:
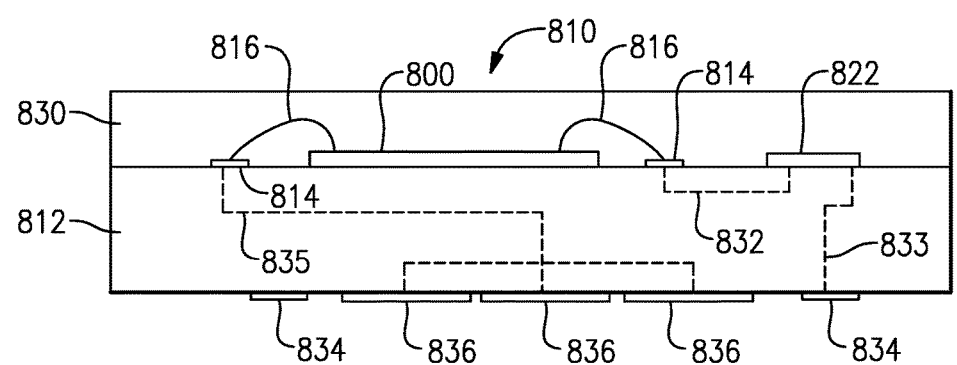
Figure 42:
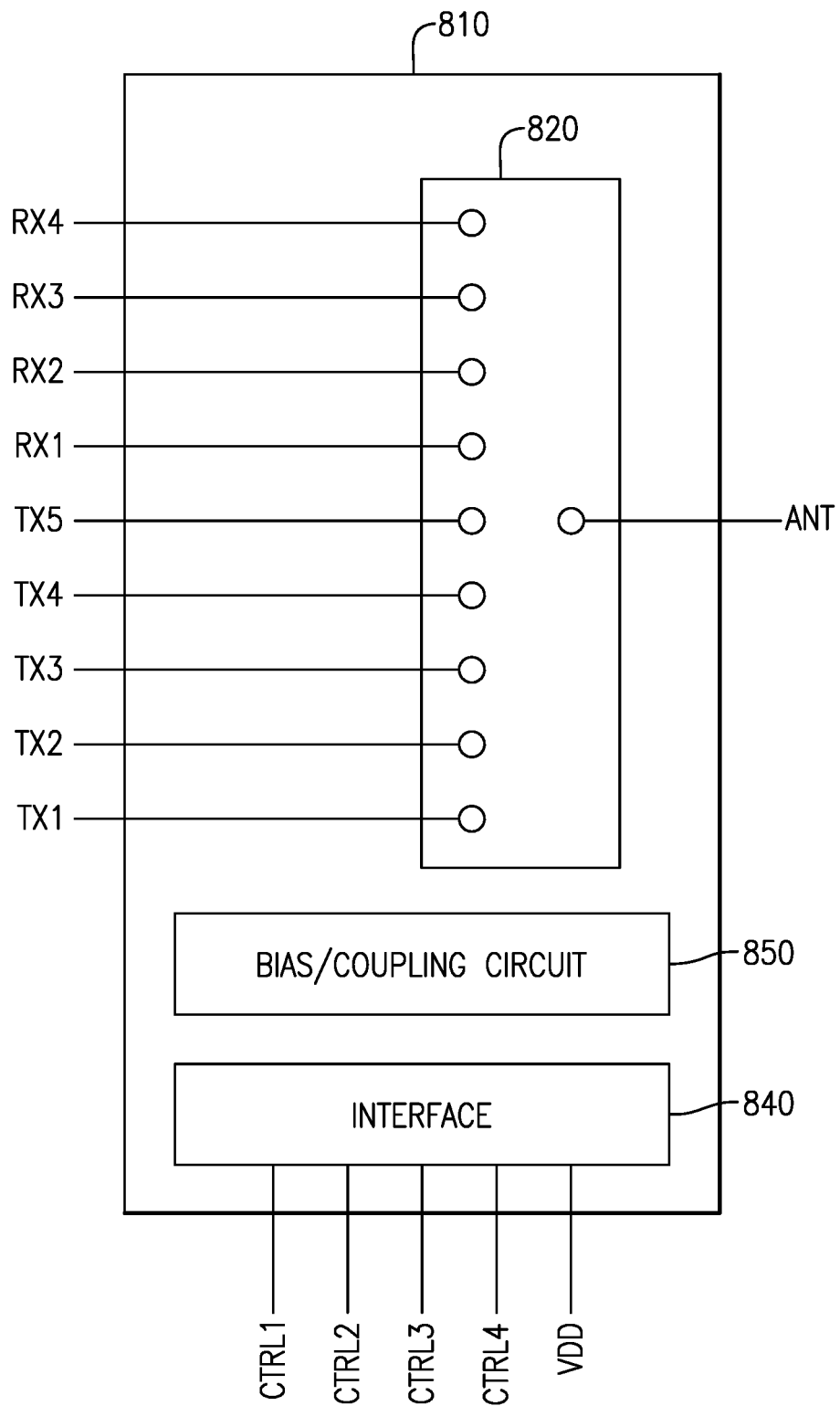
FIG. 42 illustrates a schematic diagram of an example switching configuration that can be implemented in the module of FIGS. 41A and 41B.

FIG. 42 illustrates a schematic diagram of an example switching configuration that can be implemented in the module 810 described in reference to FIGS. 41A and 41B. In the example, the switch circuit 820 is depicted as being an SP9T switch, with the pole being connectable to an antenna and the throws being connectable to various Rx and Tx paths. Such a configuration can facilitate, for example, multi-mode multi-band operations in wireless devices. As described herein, various switching configurations (e.g., including those configured for more than one antenna) can be implemented for the switch circuit 820. As also described herein, one or more throws of such switching configurations can be connectable to corresponding path(s) configured for TRx operations.

The module 810 can further include an interface for receiving power (e.g., supply voltage VDD) and control signals to facilitate operation of the switch circuit 820 and/or the bias/coupling circuit 850. In some implementations, supply voltage and control signals can be applied to the switch circuit 820 via the bias/coupling circuit 850.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 43:
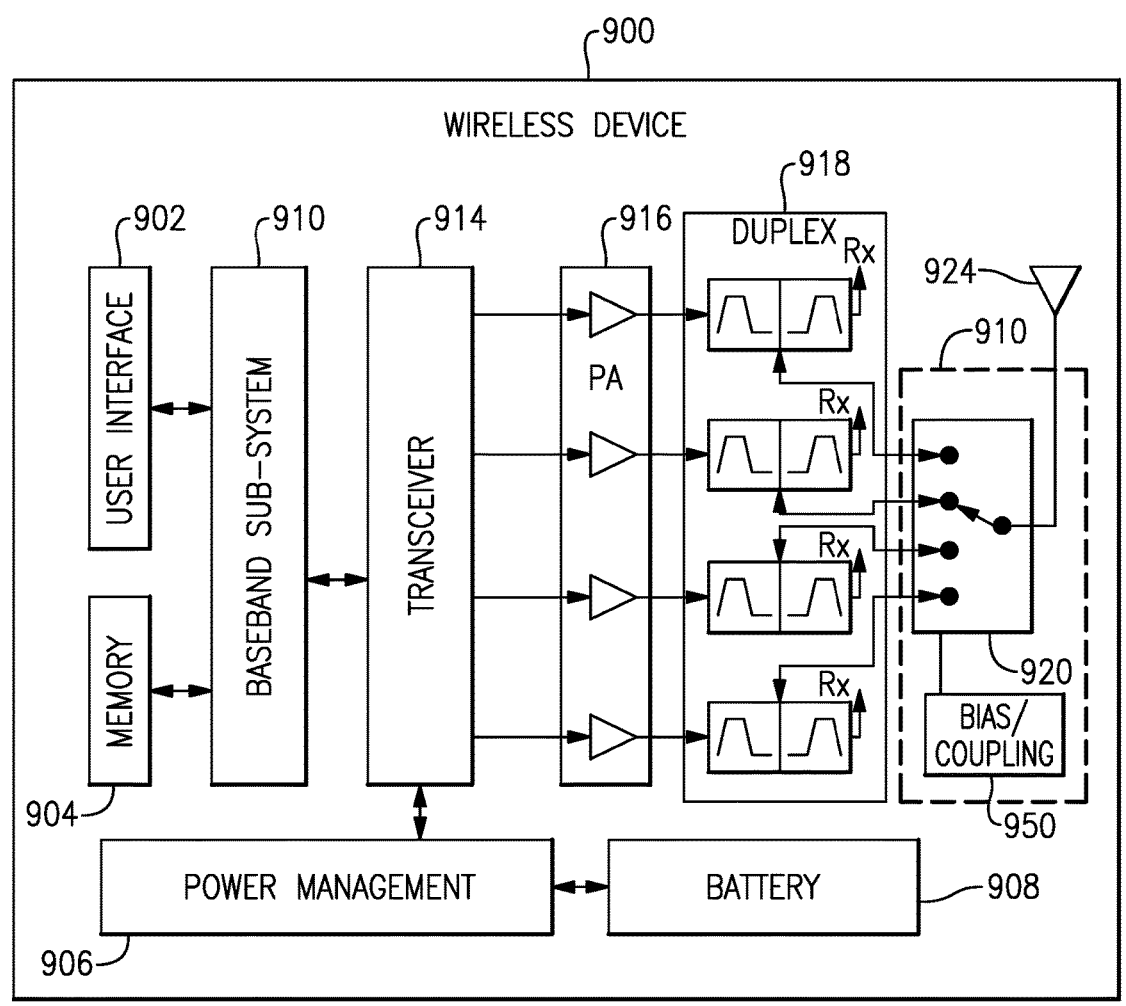
FIG. 43 depicts an example wireless device having one or more advantageous features described herein.

FIG. 43 depicts an example wireless device 900 having one or more advantageous features described herein. In the context of various switches and various biasing/coupling configurations as described herein, a switch 920 and a bias/coupling circuit 950 can be part of a module 910. In some embodiments, such a switch module can facilitate, for example, multi-band multi-mode operations of the wireless device 900.

In the example wireless device 900, a power amplifier (PA) assembly 916 having a plurality of PAs can provide one or more amplified RF signals to the switch 920 (via an assembly of one or more duplexers 918), and the switch 920 can route the amplified RF signal(s) to one or more antennas. The PAs 916 can receive corresponding unamplified RF signal(s) from a transceiver 914 that can be configured and operated in known manners. The transceiver 914 can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 910.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexers 918 can allow transmit and receive operations to be performed simultaneously using a common antenna (e.g., 924). In FIG. 43, received signals are shown to be routed to "Rx" paths that can include, for example, one or more low-noise amplifiers (LNAs).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

General Comments

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined such that multiple steps and/or phases illustrated in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those illustrated and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general-purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general-purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations illustrated and described herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency (RF) device comprising:
an insulator layer;
a field-effect transistor (FET) having terminals for a gate, a source, and a drain, the FET implemented on an active silicon layer formed over the insulator layer;
a substrate layer implemented under the insulator layer; and
a proximity electrode implemented to extend at least partially through the insulator layer, and positioned to be laterally offset from a nearest edge of the FET by an offset distance that is less than 5 μm, the proximity electrode configured to receive a voltage and generate an electric field between the proximity electrode and a region generally underneath the FET.

2. The RF device of claim 1 further comprising an electrical connection implemented to provide a signal to the proximity electrode to adjust an operating condition of the FET.

3. The RF device of claim 1 further comprising a substrate contact feature implemented to provide an electrical connection to the substrate layer.

4. The RF device of claim 3 wherein the substrate contact feature is positioned to be laterally spaced from the FET by a distance greater than or equal to 5 μm.

5. The RF device of claim 1 wherein the offset distance is less than or equal to 4 μm.

6. The RF device of claim 5 wherein the offset distance is less than or equal to 2 μm.

7. The RF device of claim 1 wherein the proximity electrode is configured to extend through the insulator layer and contact at least a portion of the substrate layer.

8. The RF device of claim 1 further comprising an interface layer implemented between the substrate layer and the insulator layer.

9. The RF device of claim 8 wherein the interface layer includes a trap-rich layer.

10. The RF device of claim 9 wherein the proximity electrode is configured to extend through the insulator layer but not the trap-rich layer.

11. The RF device of claim 9 wherein the proximity electrode is configured to extend through the insulator layer and the trap-rich layer.

12. The RF device of claim 1 wherein the substrate layer includes a plurality of doped regions having amorphous and high resistivity properties.

13. The RF device of claim 12 wherein the proximity electrode is configured to extend through the insulator layer but not the doped regions.

14. The RF device of claim 12 wherein the proximity electrode is configured to extend through the insulator layer and the doped regions.

15. The RF device of claim 1 wherein the substrate layer is a silicon handle layer.

16. The RF device of claim 1 wherein the insulator layer includes a buried oxide (BOX) layer.

17. A radio-frequency (RF) module comprising:
a packaging substrate configured to receive a plurality of devices; and
a switching device mounted on the packaging substrate, the switching device including a field-effect transistor (FET) having terminals for a gate, a source, and a drain, the FET implemented on an active silicon layer formed over an insulator layer and a substrate layer implemented under the insulator layer, the switching device further including a proximity electrode implemented to extend at least partially through the insulator layer, and positioned to be laterally offset from a nearest edge of the FET by an offset distance that is less than 5 μm, the proximity electrode configured to receive a voltage and generate an electric field between the proximity electrode and a region generally underneath the FET.

18. The RF module of claim 17 wherein the RF module is a switch module.

19. The RF module of claim 17 wherein the substrate layer is part of a silicon-on-insulator (SOI) substrate.

20. A wireless device comprising:
a transceiver configured to process radio-frequency (RF) signals;
an RF module in communication with the transceiver, the RF module including a switching device having a field-effect transistor (FET) having terminals for a gate, a source, and a drain, the FET implemented on an active silicon layer formed over an insulator layer and a substrate layer implemented under the insulator layer, the switching device further including a proximity electrode implemented to extend at least partially through the insulator layer, and positioned to be laterally offset from a nearest edge of the FET by an offset distance that is less than 5 µm, the proximity electrode configured to receive a voltage and generate an electric field between the proximity electrode and a region generally underneath the FET; and an antenna in communication with the RF module, the antenna configured to facilitate transmitting or receiving of the RF signals.

* * * * *